US009355938B2

(12) United States Patent
Hariharan et al.

(10) Patent No.: US 9,355,938 B2
(45) Date of Patent: May 31, 2016

(54) CONDUCTIVE COMPOSITIONS AND METHODS OF USING THEM

(71) Applicant: ALPHA METALS, INC., South Plainfield, NJ (US)

(72) Inventors: Rajan Hariharan, Duluth, GA (US); James Hurley, Atlanta, GA (US); Senthil Kanagavel, Roswell, GA (US); Jose Quinones, Gainesville, GA (US); Martin Sobczak, Cumming, GA (US); Deborah Makita, Lawrenceville, GA (US)

( * ) Notice: Subject to any disclaimer, the term of this patent is extended or adjusted under 35 U.S.C. 154(b) by 0 days.

(21) Appl. No.: 14/058,553

(22) Filed: Oct. 21, 2013

(65) Prior Publication Data

US 2014/0153167 A1    Jun. 5, 2014

Related U.S. Application Data

(62) Division of application No. 12/567,523, filed on Sep. 25, 2009, now Pat. No. 8,564,140.

(60) Provisional application No. 61/100,525, filed on Sep. 26, 2008.

(51) Int. Cl.

| | | |
|---|---|---|
| *H01L 23/48* | (2006.01) | |
| *H01L 23/52* | (2006.01) | |
| *H01L 29/40* | (2006.01) | |
| *H05K 5/00* | (2006.01) | |
| *H05K 7/00* | (2006.01) | |
| *H01B 1/02* | (2006.01) | |
| *H01B 1/22* | (2006.01) | |
| *C09K 5/00* | (2006.01) | |
| *H01L 23/492* | (2006.01) | |
| *B23K 35/36* | (2006.01) | |
| *H01L 23/498* | (2006.01) | |
| *H05K 7/02* | (2006.01) | |
| *C08K 5/09* | (2006.01) | |

(52) U.S. Cl.
CPC ........ *H01L 23/4928* (2013.01); *B23K 35/3612* (2013.01); *H01B 1/22* (2013.01); *H01L 23/49883* (2013.01); *H05K 7/02* (2013.01); *B23K 2201/36* (2013.01); *C08K 5/09* (2013.01); *H01L 2924/0002* (2013.01)

(58) Field of Classification Search
CPC ................. H01L 2924/0002; H01L 2924/00; H01L 2224/80855; H01L 23/488; H01L 23/4928; H01L 23/49883; H01L 2924/013; H01L 2924/014; B23K 2201/36; B23K 35/3612; C08K 5/09; H01B 1/22; H05K 7/02
USPC .......... 257/772, 779, E23.023; 252/512, 514, 252/79; 361/679.01; 427/58
See application file for complete search history.

(56) References Cited

U.S. PATENT DOCUMENTS

| | | | |
|---|---|---|---|
| 2,046,886 A | 7/1936 | Strain | |
| 2,099,047 A | 11/1937 | Bradshaw | |
| 3,164,570 A | 1/1965 | Horn | |
| 3,255,147 A | 6/1966 | Krueger | |
| 3,706,712 A | 12/1972 | Davis et al. | |
| 3,838,101 A | 9/1974 | Steele et al. | |
| 5,062,896 A | 11/1991 | Huang et al. | |
| 5,376,403 A | 12/1994 | Capote et al. | |
| 6,440,228 B1 | 8/2002 | Taguchi et al. | |
| 6,555,594 B1 * | 4/2003 | Fukushima et al. | 522/81 |
| 6,630,036 B2 | 10/2003 | Saita et al. | |
| 6,653,381 B2 | 11/2003 | Thames et al. | |
| 7,476,705 B2 * | 1/2009 | Pajerski | 524/591 |
| 2001/0031883 A1 | 10/2001 | Thames et al. | |
| 2002/0007080 A1 | 1/2002 | Thames et al. | |
| 2003/0127496 A1 | 7/2003 | Tetsuka et al. | |
| 2008/0003450 A1 | 1/2008 | Carey et al. | |
| 2008/0048009 A1 | 2/2008 | Maeda et al. | |
| 2009/0137734 A1 * | 5/2009 | Pajerski | 524/591 |
| 2009/0269598 A1 | 10/2009 | Ohashi et al. | |
| 2010/0147567 A1 * | 6/2010 | Hino et al. | 174/257 |
| 2014/0060703 A1 * | 3/2014 | Pujari et al. | 148/25 |

FOREIGN PATENT DOCUMENTS

| | | |
|---|---|---|
| EP | 0450278 A1 | 10/1991 |
| WO | 2008017062 A1 | 2/2008 |

OTHER PUBLICATIONS

Palmer et al. "Forming High Temperature Soldering Joints Through Liquid Phase Sintering of Solder Paste." J. Electronics Mat., 28, 1999, pp. 1189-1193.
Palmer et al. "Forming Solder Joints by Sintering Eutectic Tin—Lead Solder Paste." J. Electronics Mat., 28, 1999, pp. 912-915.
Shearer et al. "Transient Liquid Phase Sintering Composites." J. Electronics Mat., 28, 1999, pp. 1319-1326.
Y. Lei et al. "Cure kinetics of aqueous phenol-formaldehyde resins used for oriented strandboard manufacturing: Analytical technique." J. Appl. Poly. Sci., vol. 100, (2006) pp. 1642-1658.

* cited by examiner

*Primary Examiner* — Teresa M Arroyo
(74) *Attorney, Agent, or Firm* — Carmody Torrance Sandak & Hennessey LLP

(57) ABSTRACT

A conductive composition includes a mono-acid hybrid that includes an unprotected, single reactive group. The mono-acid hybrid may include substantially non-reactive groups elsewhere such that the mono-acid hybrid is functional as a chain terminator. Methods and devices using the compositions are also disclosed.

1 Claim, 8 Drawing Sheets

CONDUCTIVE COMPOSITIONS AND METHODS OF USING THEM

CROSS-REFERENCE TO RELATED APPLICATIONS

The present application is a divisional of U.S. patent application Ser. No. 12/567,523 filed on Sep. 25, 2009, now U.S. Pat. No. 8,564,140, which in turn claims priority under 35 U.S.C. §119(e) to U.S. Provisional Patent Application Ser. No. 61/100,525, entitled "CONDUCTIVE COMPOSITIONS AND METHODS OF USING THEM" filed on Sep. 26, 2008, which is hereby incorporated herein by reference in its entirety for all purposes.

TECHNOLOGICAL FIELD

Certain embodiments disclosed herein relate generally to conductive compositions. More particularly, certain examples described herein are directed to compositions produced using mono-acid hybrids that include a single reactive site.

BACKGROUND

Compositions used to provide an electrical connection can suffer from outgassing, premature curing and other unwanted side effects that can reduce the overall usability of such compounds. In particular, premature cross-linking of the compositions can greatly reduce pot life, which places unwanted time constraints on using the compositions.

SUMMARY

Certain features, aspect, embodiments and examples described herein are directed to conductive lead free polymer/metal compositions with room temperature stability, sufficient enough to render the product useful in high volume manufacturing environments for at least about eight hours, for example. More specifically, embodiments disclosed herein may be used to provide a metal-polymer-composite joint that is formed, after processing the conductive composition, having sufficient thermal and/or electrical conductivity and exhibiting low contact resistance to replace soft solder wire, or solder paste in electronic assemblies. Furthermore, the joint can maintain sufficient mechanical strength to reduce or to prevent damage to wire bonds or adversely affect the assembly where it can not perform its intended function. In certain embodiments, the flux power provided by a mono-acid hybrid is sufficient to clean oxide from metal powders allowing the soldering of metal particles such as, for example, copper particles, together during a heating profile. Further, the flux can react to eliminate or reduce possible corrosion problems normally caused by acidic residues.

In a first aspect, a conductive composition comprising an mono-acid ester hybrid comprising an unprotected, single reactive group at a first terminus and substantially non-reactive groups elsewhere such that the ester hybrid is functional as a chain terminator, an epoxy resin, and an effective amount of at least one metal to render the composition conductive is provided. In some examples, the composition may also include an anhydride.

In certain embodiments, the at least one metal is selected from the group consisting of copper, silver, tin, bismuth, indium, antimony coated copper, silver coated copper, tin coated copper and alloys thereof. In other embodiments, the at least one metal is selected from the group consisting of capped metal particles, coated metal particles, uncapped metal particles, uncoated metal particles, metal powders, metal flakes, metal alloys and combinations thereof. In some examples, the single reactive group of the mono-acid ester hybrid can be a hydroxyl group. In other examples, the epoxy resin can be selected from the group consisting of an epoxidized bisphenol F, an epoxidized bisphenol A, a cycloaliphatic epoxy resin, a naphthalenic epoxy resin, an epoxy novalac resin, a dicyclopentadiene epoxy resin, a perfluorinated epoxy resin, an epoxidized silicone resin, a multifunctional epoxy resin and combinations thereof. In certain examples, the composition may further comprise an anhydride selected from the group consisting of methyl hexahydrophthalic anhydride, tetrahydrophthalic anhydride, nadic methyl anhydride and alkenyl succinic anhydride. In additional examples, the mono-acid ester hybrid can be present from about 0.5% to about 10% by weight, the epoxidized phenol can be present from about 2% to about 18% by weight, and the metal can be present from about 80% by weight to about 95% by weight, wherein the weight percentages are all based on weight of the composition.

In certain examples, the metal is silver coated copper, the epoxy resin is epoxidized bisphenol F, and the mono-acid ester hybrid is mono-ethyl succinate.

In some examples, the metal is present at 80-95% by weight based on the weight of the composition.

In other examples, the mono-acid ester hybrid is a compound having the following formula:

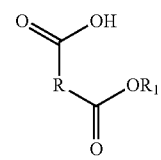

wherein R and $R_1$ are each independently selected from the group consisting of C1-C6 alkyl groups, C1-C6 aliphatic groups, and C1-C9 aromatic groups, any of which may be substituted with one or more functionalities that are substantially non-reactive to avoid cross-linking with other components of the composition.

In certain examples, the mono-acid ester hybrid is a compound having the following formula:

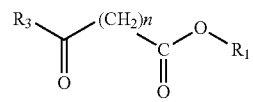

wherein $R_3$ is —OH, wherein $R_1$ is a selected from the group consisting of a saturated carbon chain including one to six carbon atoms, and wherein n is between one and six to provide an aliphatic or cyclic structure between the carbonyl groups.

In another aspect, a conductive composition comprising a metal, a solder or solder alloy, a resin, a mono-acid ester hybrid comprising an unprotected, single reactive group at a first terminus and substantially non-reactive groups elsewhere such that the ester hybrid is functional as a chain terminator is disclosed.

In certain embodiments, the metal can be selected from the group consisting of copper, silver, tin, bismuth, indium, antimony coated copper, silver coated copper, tin coated copper, alloys thereof and combinations thereof. In other embodiments, the coating of the metal may be added using electroless or electrolytic plating. In some embodiments, the metal can be selected from the group consisting of capped metal particles, coated metal particles, uncapped metal particles, uncoated metal particles, metal powders, metal flakes, metal alloys and combinations thereof. In some examples, the solder comprises tin, bismuth, lead, indium, antimony, and mixtures and alloys thereof and mixtures of alloys.

In certain examples, the resin can be selected from the group consisting of an epoxy resin, a phenolic resin, a phenolic novolac resin, a cresolic novalac resin, a polyurethane, a polymide, a maleimide, a bismaleimide, a cyanate ester, a dicyanate ester resin, a polyvinyl alcohol, a polyester, a polyurea, an acrylic, a polyamide, a polyacrylate, a polysiloxane, a cyanoacrylate and combinations thereof.

In some embodiments, the composition may further comprise at least one additional component that comprises one or more reactive moieties selected from the group consisting of an epoxy group, an amine group, an amide group, an alcohol group, an alkenyl group, an allyl group, an acrylate, a methacrylate, a cyanate ester, a dicyanate ester, a maleimide, a bismaleimide, an anhydride, a benzoxazine and combinations thereof.

In certain examples, the composition may further comprise an anhydride that can be selected from the group consisting methyl hexahydrophthalic anhydride, tetrahydrophthalic anhydride, nadic methyl anhydride, alkenyl succinic anhydride and combinations thereof.

In some examples, the resin may be selected from the group consisting of epoxidized bisphenol F, epoxidized bisphenol A, a cycloaliphatic epoxy resin, a naphthalenic epoxy resin, an epoxy novalac resin, a dicyclopentadiene epoxy resin, a perfluorinated epoxy resin, an epoxidized silicone resin, a multifunctional epoxy resin and combinations thereof.

In other examples, the single reactive group of the mono-acid ester hybrid is a hydroxyl group. In additional examples, the metal can be present from about 80% to about 95% by weight, the solder is present from about 35% to about 65% by weight, the resin is present from about 2% by weight to about 18% by weight, the mono-acid ester hybrid is present from about 0.5% by weight to about 10% by weight, wherein the weight percentages are all based on weight of the composition.

In certain embodiments, the mono-acid ester hybrid can be a compound having the following formula:

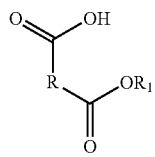

wherein R and $R_1$ are each independently selected from the group consisting of C1-C6 alkyl groups, C1-C6 aliphatic groups, and C1-C9 aromatic groups, any of which may be substituted with one or more functionalities that are substantially non-reactive to avoid cross-linking with other components of the composition.

In certain embodiments, the mono-acid ester hybrid can be a compound having the following formula:

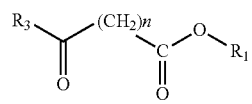

wherein $R_3$ is —OH, wherein $R_1$ is a saturated carbon chain including one to six carbon atoms, and wherein n is between one and six to provide an aliphatic or cyclic structure between the carbonyl groups.

In an additional aspect, a composition comprising a metal and an organic binder comprising an epoxy resin, and a mono-acid ester hybrid comprising an unprotected, single reactive group at a first terminus and substantially non-reactive groups elsewhere such that the ester hybrid is functional as a chain terminator is disclosed.

In certain embodiments, the metal can be selected from the group consisting of capped metal particles, coated metal particles, uncapped metal particles, uncoated metal particles, metal powders, metal flakes and metal alloys. In other embodiments, the metal can be selected from the group consisting of copper, silver, tin, bismuth, indium, antimony coated copper, silver coated copper, tin coated copper and alloys thereof.

In certain examples, the mono-acid ester hybrid of the organic binder is a compound having the following formula:

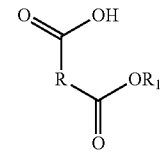

wherein R and $R_1$ are each independently selected from the group consisting of C1-C6 alkyl groups, C1-C6 aliphatic groups, and C1-C9 aromatic groups, any of which may be substituted with one or more functionalities that are substantially non-reactive to avoid cross-linking with other components of the composition.

In other examples, the mono-acid ester hybrid of the organic binder is a compound having the following formula:

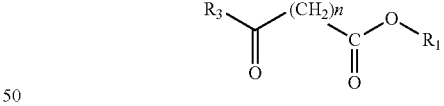

wherein $R_3$ is —OH, wherein $R_1$ is a saturated carbon chain including one to six carbon atoms, and wherein n is between one and six to provide an aliphatic or cyclic structure between the carbonyl groups.

In another aspect, an electronic component comprising a semiconductor chip with a solderable surface to provide one or more vertical interconnection pathways, and a cured electrically conductive composition, the composition comprising, prior to curing, an mono-acid ester hybrid comprising an unprotected, single reactive group at a first terminus and substantially non-reactive groups elsewhere such that the mono-acid ester hybrid is functional as a chain terminator, an epoxy resin, and an effective amount of at least one metal to render the composition electrically conductive is disclosed.

In certain embodiments, the mono-acid ester hybrid of the composition is a compound having the following formula:

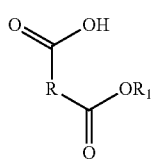

wherein R and $R_1$ are each independently selected from the group consisting of C1-C6 alkyl groups, C1-C6 aliphatic groups, and C1-C9 aromatic groups, any of which may be substituted with one or more functionalities that are substantially non-reactive to avoid cross-linking with other components of the composition.

In certain embodiments, the mono-acid ester hybrid of the composition is a compound having the following formula:

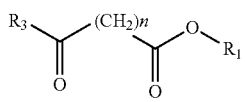

wherein $R_3$ is —OH, wherein $R_1$ is a saturated carbon chain including one to six carbon atoms, and wherein n is between one and six to provide an aliphatic or cyclic structure between the carbonyl groups.

In an additional aspect, a semiconductor component comprising a semiconductor chip with a solderable surface to provide one or more vertical interconnection pathways to a substrate, and an electrically conductive composition comprising at least one of the compositions described herein is provided.

In another aspect, a method of assembling an electronic component comprising a multilayer assembly, the method comprising disposing at least one of the compositions as described herein on or in a layer between a top layer and a bottom layer to provide a thermal and/or electrical pathway between at least two non-adjacent layers in the electronic component is disclosed.

In an additional aspect, a method of facilitating assembly of an electronic component comprising providing a thermally and/or electrically conductive composition comprising a mono-acid ester hybrid, a resin, an anhydride and an effective amount of a metal to render the composition thermally and/or electrically conductive, wherein the mono-acid ester hybrid of the composition is a compound having formula (I) or formula (II) as shown herein is provided.

In another aspect, a method of facilitating assembly comprising providing at least one of the compositions as described herein is disclosed.

In an additional aspect, a method of attaching a semiconductor chip to a substrate comprising depositing a composition as described in the claims on a substrate, depositing an electrical component on the deposited composition, and curing the deposited composition to attach the semiconductor chip to the substrate.

In some examples, any of the compositions described herein may include a latent catalyst. In certain examples, the latent catalyst can be selected from the group consisting of triphenylphosphine (TPP), tetraphenylphosphonium tetraphenylborate (TPP-K), and triphenylphosphine-benzoquinone (TPP-BQ) and combinations thereof.

In other examples, any of the compositions described herein may include a monofunctional diluent, either alone or with a latent catalyst or other component. In some examples, the monofunctional diluent is selected from the group consisting of a substituted phenyl glycidyl ether, an alkylphenyl glycidyl ether or an aliphatic glycidyl ether. More specifically, t-butylphenyl glycidyl ether, alkyl C8-C14 glycidyl ether, butyl glycidyl ether, cresyl glycidyl ether, phenyl glycidyl ether, nonylphenyl glycidyl ether, 2-ethylhexyl glycidyl ether, and combinations thereof.

In certain embodiments, the metal used in the compositions described herein may be capped or coated with one or more materials selected from the group consisting of a thermoplastic resin, a solid thermosetting resin, and a self assembly monolayer. In some examples, the thermoplastic resin can be present in an effective amount to increase mechanical properties such as adhesion, fatigue resistance, flexural strength, flexural modulus, high temperature modulus, and/or fracture toughness. In other examples, the metal is coated with an antioxidant material. In certain examples, the antioxidant material is selected from the group consisting of a triazole, a benzotriazole, a benzamidizole, an imidizole, an organic acid and combinations thereof. In some examples, the antioxidant may be a material that can reduce or prevent oxidation of the metal and can be subsequently removed through a diffusion process, dissolution, melting or dissolving.

In an additional aspect, an electronic assembly comprising at least one electronic component comprises one or more of the compositions described herein and an overmold disposed on or around the electronic component is provided. In some examples, the electronic component is a semiconductor component. In other examples, the overmold can be selected from the group consisting of an epoxy mold compound, a silicon encapsulant, a liquid epoxy encapsulant, glass, a transfer molded epoxy resin, and a liquid injected molded resin.

In another aspect, an electronic package comprising an electronic component comprising one or more of the compositions described herein within a cavity package to protect the electronic component is disclosed. In certain embodiments, the cavity package comprises a lid that caps the package. In some examples, the lid can be sealed to the cavity package using one or more materials selected from the group consisting of solder, glass, frit, and a polymer sealant. In other examples, the lid can be sealed to the cavity package using diffusion bonding or aniodic bonding.

In an additional aspect, a method of depositing at least one of the compositions described herein on a substrate, the method comprising dispensing the composition on the substrate is provided.

In another aspect, a method of depositing at least one of the compositions described herein on a substrate, the method comprising screen printing the composition on the substrate is disclosed.

In an additional aspect, a method of depositing at least one of the compositions described herein on a substrate, the method comprising stencil printing the composition on the substrate is provided.

In another aspect, a method of depositing at least one of the compositions described herein on a substrate, the method comprising jetting the composition on the substrate is disclosed.

In an additional aspect, a method comprising applying one or more of the compositions described herein to a wafer, and drying the wafer. In some examples, the method may also include polymerizing the applied composition.

In accordance with one or more embodiments, a conductive composition may comprise at least one metal, a solder or solder alloy, a resin and a mono-acid hybrid comprising an unprotected, single reactive group at a first terminus and substantially non-reactive groups elsewhere such that the mono-acid hybrid is functional as a chain terminator.

In some embodiments, the at least one metal is selected from the group consisting of copper, silver, silver coated copper, tin coated copper, capped copper, aluminum and combinations thereof. In certain embodiments, the at least one solder or solder alloy is selected from the group consisting of bismuth, copper, silver, tin, indium, antimony, alloys thereof and combinations thereof. In at least one embodiment, the at least one metal is selected from the group consisting of capped metal particles, coated metal particles, uncapped metal particles, uncoated metal particles, metal powders, metal flakes, metal alloys and combinations thereof.

In some embodiments, the mono-acid hybrid is a compound having the following formula:

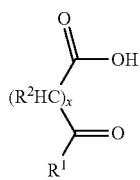

wherein X equals 1 to 9 and $R^1$ and $R^2$ are each independently selected from the group consisting of H, C1-C6 alkyl groups, C1-C6 aliphatic groups, C1-C6 alkoxy groups, and C1-C9 aromatic groups, any of which may be substituted with one or more functionalities that are substantially non-reactive to avoid cross-linking with other components of the composition.

In some embodiments, the resin is selected from the group consisting of an epoxidized bisphenol F resin, an epoxidized bisphenol A resin, a cycloaliphatic epoxy resin, a aliphatic epoxy resin, a naphthalenic epoxy resin, an epoxy novalac resin, a dicyclopentadiene epoxy resin, a perfluorinated epoxy resin, an epoxidized silicone resin, a biphenyl epoxy resin, a hydrogenated bisphenol F resin, a hydrogenated bisphenol A resin, a cyclohexyl diglycidyl ether resin, a multifunctional epoxy resin, a phenolic resin, a phenolic novalac resin, a cresolic novalac resin, a polyurethane, a polymide, a maleimide, a bismaleimide, a cyanate ester, a dicyanate ester resin, a benzoxazine, an epoxidized silicon, a polyvinyl alcohol, a polyester, a polyurea, an acrylic, an acrylate, a polyolefin, a dicyclopentadiene, a functionalized polyurethane, polybutadiene, functionalized polybutadiene, carboxyterminated butadiene-acrylonitrile, a siloxane polyimide, a polyamide, a polyacrylate, a polysiloxane, a cyanoacrylate and combinations thereof.

In some embodiments, the conductive composition further comprises an anhydride selected from the group consisting of methyl hexahydrophthalic anhydride, tetrahydrophthalic anhydride, nadic methyl anhydride, alkenyl succinic anhydride and combinations thereof.

In some embodiments, the at least one metal is present from about 10% to about 60% by weight, the solder is present from about 30% to about 90% by weight, the resin is present from about 1% by weight to about 18% by weight, the mono-acid hybrid is present from about 0.5% by weight to about 10% by weight, wherein the weight percentages are all based on a weight of the composition. In at least one embodiment, the at least one metal is copper, the solder or solder alloy is a combination of SnBi and SnAgCu, the epoxy resin is epoxidized bisphenol F, and the mono-acid hybrid is levulinic acid.

In some embodiments, the conductive composition further comprises at least one additional component that comprises one or more reactive moieties selected from the group consisting of an epoxy group, an amine group, an amide group, an alcohol group, an alkenyl group, a vinyl group, an acid group, an allyl group, an acrylate, a methacrylate, a cyanate ester, a dicyanate ester, a maleimide, a bismaleimide, an anhydride, a benzoxazine and combinations thereof.

In some embodiments, the conductive composition further comprises a latent catalyst selected from the group consisting of triphenylphosphine (TPP), tetraphenylphosphonium tetraphenylborate (TPP-K), and triphenylphosphine-benzoquinone (TPP-BQ), an imidizole, 1-Methylimidazole, 2-Methylimidazole, 2-ethyl-4-methylimidazole, 2-ethyl-4methylimidazoline, 2-benzyl-4-methylimidazole, 2-benzyl-4-methylimidazoline, 2ethylimidazole, 2-phenylimidazole, 2-phenyl-4,5-dihydroxymethyimidazole, 1-(2Cyanoethyl)-2-ethyl-4-methylimidazole, 1-(2-cyanoethyl)-2-phenyl-4,5-di(cyanoethoxymethyl) Imidazole, 1-cyanoethyl-2-methylimidazole, a dicyandiamide, Diamino-6[2'-methylimidazolyl-(1')]ethyl-striazine 2,4-, isocyanuric, 2Heptadecylimidazole and combinations thereof.

In some embodiments, the conductive composition further comprises a monofunctional diluent selected from the group consisting of a substituted phenyl glycidyl ether, an alkylphenyl glycidyl ether or an aliphatic glycidyl ether, in which any of the ethers is one or more of t-butylphenyl glycidyl ether, alkyl C8-C14 glycidyl ether, butyl glycidyl ether, cresyl glycidyl ether, phenyl glycidyl ether, nonylphenyl glycidyl ether, 2-ethylhexyl glycidyl ether and combinations thereof.

In some embodiments, the at least one metal is capped or coated with one or more materials selected from the group consisting of a thermoplastic resin, a solid thermosetting resin, a self assembly monolayer used as an antioxidant and combinations thereof. In at least one embodiment, the antioxidant material is selected from the group consisting of a triazole, a benzotriazole, a benzamidizole, an imidizole, or an organic acid and combinations thereof.

In accordance with one or more embodiments, an electronic component may comprise a semiconductor chip with a solderable surface to provide one or more vertical interconnection pathways, and a cured electrically conductive composition, the composition comprising, prior to curing, an mono-acid hybrid comprising an unprotected, single reactive group at a first terminus and substantially non-reactive groups elsewhere such that the mono-acid hybrid is functional as a chain terminator, an epoxy resin, and an effective amount of at least one metal to render the composition electrically conductive.

In some embodiments, the mono-acid hybrid of the composition is a compound having the following formula:

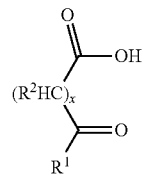

wherein X equals 1 to 9 and $R^1$ and $R^2$ are each independently selected from the group consisting of H, C1-C6 alkyl groups, C1-C6 aliphatic groups, C1-C6 alkoxy groups, and C1-C9 aromatic groups, any of which may be substituted with one or more functionalities that are substantially non-reactive to avoid cross-linking with other components of the composition.

In accordance with one or more embodiments, a semiconductor component may comprise a semiconductor chip with a solderable surface to provide one or more vertical interconnection pathways to a substrate with a solderable surface and an electrically conductive composition comprising at least one metal, a solder or solder alloy, a resin and a mono-acid hybrid comprising an unprotected, single reactive group at a first terminus and substantially non-reactive groups elsewhere such that the mono-acid hybrid is functional as a chain terminator.

In accordance with one or more embodiments, a method of facilitating assembly of an electronic component may comprise providing a thermally and/or electrically conductive composition comprising a mono-acid hybrid, a resin, an anhydride and an effective amount of a metal to render the composition thermally and/or electrically conductive, wherein the mono-acid hybrid of the composition is a compound having the following formula:

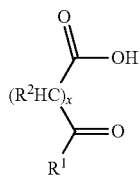

wherein X equals 1 to 9 and $R^1$ and $R^2$ are each independently selected from the group consisting of H, C1-C6 alkyl groups, C1-C6 aliphatic groups, C1-C6 alkoxy groups, and C1-C9 aromatic groups, any of which may be substituted with one or more functionalities that are substantially non-reactive to avoid cross-linking with other components of the composition.

In accordance with one or more embodiments, an electronic assembly may comprise at least one electronic component comprising a conductive composition comprising at least one metal, a solder or solder alloy, a resin and a mono-acid hybrid comprising an unprotected, single reactive group at a first terminus and substantially non-reactive groups elsewhere such that the mono-acid hybrid is functional as a chain terminator. The electronic assembly further comprises an overmold disposed on or around the electronic component, wherein the overmold is selected from the group consisting of an epoxy mold compound, a silicon encapsulant, a liquid epoxy encapsulant, glass, a transfer molded epoxy resin, and a liquid injected molded resin.

In accordance with one or more embodiments, an electronic package may comprise an electronic component comprising a conductive composition within a cavity package to protect the electronic component. The conductive composition comprises at least one metal, a solder or solder alloy, a resin and a mono-acid hybrid comprising an unprotected, single reactive group at a first terminus and substantially non-reactive groups elsewhere such that the mono-acid hybrid is functional as a chain terminator. The cavity package comprises a lid that caps the package and is sealed to the cavity package via diffusion bonding or aniodic bonding using one or more materials selected from the group consisting of solder, glass, frit, and a polymer sealant.

In accordance with one or more embodiments, a method of depositing a conductive composition comprising at least one metal, a solder or solder alloy, a resin and a mono-acid hybrid comprising an unprotected, single reactive group at a first terminus and substantially non-reactive groups elsewhere such that the mono-acid hybrid is functional as a chain terminator on a substrate is disclosed. The method comprises dispensing the composition on the substrate, screen printing the composition on the substrate, stencil printing the composition on the substrate, jetting the composition on the substrate, or applying the composition on a wafer and drying the wafer.

In accordance with one or more embodiments, a conductive composition may comprise at least one metal, a solder or solder alloy, a resin and a mono-acid ester hybrid comprising an unprotected, single reactive group at a first terminus and substantially non-reactive groups elsewhere such that the ester hybrid is functional as a chain terminator.

In some embodiments, the at least one metal is selected from the group consisting of copper, silver, silver coated copper, tin coated copper, capped copper, aluminum and combinations thereof. The at least one solder or solder alloy may be selected from the group consisting of bismuth, copper, silver, tin, indium, antimony, alloys thereof and combinations thereof. In some embodiments, the at least one metal is selected from the group consisting of capped metal particles, coated metal particles, uncapped metal particles, uncoated metal particles, metal powders, metal flakes, metal alloys and combinations thereof.

In at least one embodiment, the mono-acid ester hybrid is a compound having the following formula:

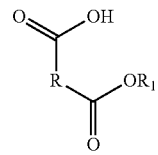

wherein R and $R_1$ are each independently selected from the group consisting of C1-C6 alkyl groups, C1-C6 aliphatic groups, and C1-C9 aromatic groups, any of which may be substituted with one or more functionalities that are substantially non-reactive to avoid cross-linking with other components of the composition.

In some embodiments, the resin is selected from the group consisting of an epoxidized bisphenol F resin, an epoxidized bisphenol A resin, a cycloaliphatic epoxy resin, a aliphatic epoxy resin, a naphthalenic epoxy resin, an epoxy novalac resin, a dicyclopentadiene epoxy resin, a perfluorinated epoxy resin, an epoxidized silicone resin, a biphenyl epoxy resin, a hydrogenated bisphenol F resin, a hydrogenated bisphenol A resin, a cyclohexyl diglycidyl ether resin, a multifunctional epoxy resin, a phenolic resin, a phenolic novolac resin, a cresolic novalac resin, a polyurethane, a polymide, a maleimide, a bismaleimide, a cyanate ester, a dicyanate ester resin, a benzoxazine, an epoxidized silicon, a polyvinyl alcohol, a polyester, a polyurea, an acrylic, an acrylate, a polyolefin, a dicyclopentadiene, a functionalized polyurethane, polybutadiene, functionalized polybutadiene, carboxyterminated butadiene-acrylonitrile, a siloxane polyimide, a polyamide, a polyacrylate, a polysiloxane, a cyanoacrylate and combinations thereof.

In some embodiments, the conductive composition may further comprise an anhydride selected from the group consisting of methyl hexahydrophthalic anhydride, tetrahydrophthalic anhydride, nadic methyl anhydride, alkenyl succinic anhydride and combinations thereof. In at least one embodiment, the at least one metal is present from about 10% to about 60% by weight, the solder or solder alloy is present from about 30% to about 90% by weight, the resin is present from about 1% by weight to about 18% by weight, and the mono-acid ester hybrid is present from about 0.5% by weight to about 10% by weight, wherein the weight percentages are all based on a weight of the composition.

In some embodiments, the at least one metal is copper, the solder or solder alloy is a combination of SnBi and SnAgCu, the epoxy resin is epoxidized bisphenol F, and the mono-acid ester hybrid is mono-ethyl succinate. The conductive composition may further comprise at least one additional component that comprises one or more reactive moieties selected from the group consisting of an epoxy group, an amine group, an amide group, an alcohol group, an alkenyl group, a vinyl group, an acid group, an allyl group, an acrylate, a methacrylate, a cyanate ester, a dicyanate ester, a maleimide, a bismaleimide, an anhydride, a benzoxazine and combinations thereof.

In some embodiments, the conductive composition may further comprise a latent catalyst selected from the group consisting of triphenylphosphine (TPP), tetraphenylphosphonium tetraphenylborate (TPP-K), and triphenylphosphine-benzoquinone (TPP-BQ), an imidizole, 1-Methylimidazole, 2-Methylimidazole, 2-ethyl-4-methylimidazole, 2-ethyl-4methylimidazoline, 2-benzyl-4-methylimidazole, 2-benzyl-4-methylimidazoline, 2ethylimidazole, 2-phenylimidazole, 2-phenyl-4,5-dihydroxymethyimidazole, 1-(2Cyanoethyl)-2-ethyl-4-methylimidazole, 1-(2-cyanoethyl)-2-phenyl-4,5-di(cyanoethoxymethyl) Imidazole, 1-cyanoethyl-2-methylimidazole, a dicyandiamide, Diamino-6[2'-methylimidazolyl-(1')]ethyl-striazine 2,4-, isocyanuric, 2Heptadecylimidazole and combinations thereof.

In some embodiments, the conductive composition may further comprise a monofunctional diluent selected from the group consisting of a substituted phenyl glycidyl ether, an alkylphenyl glycidyl ether or an aliphatic glycidyl ether, in which any of the ethers is one or more of t-butylphenyl glycidyl ether, alkyl C8-C14 glycidyl ether, butyl glycidyl ether, cresyl glycidyl ether, phenyl glycidyl ether, nonylphenyl glycidyl ether, 2-ethylhexyl glycidyl ether and combinations thereof.

In at least one embodiment, the at least one metal is capped or coated with one or more materials selected from the group consisting of a thermoplastic resin, a solid thermosetting resin, a self assembly monolayer used as an antioxidant and combinations thereof. The antioxidant material may be selected from the group consisting of a triazole, a benzotriazole, a benzamidizole, an imidizole, or an organic acid and combinations thereof.

In accordance with one or more embodiments, an electronic component may comprise a semiconductor chip with a solderable surface to provide one or more vertical interconnection pathways and a cured electrically conductive composition, the composition comprising, prior to curing, an mono-acid ester hybrid comprising an unprotected, single reactive group at a first terminus and substantially non-reactive groups elsewhere such that the mono-acid ester hybrid is functional as a chain terminator, an epoxy resin, and an effective amount of at least one metal to render the composition electrically conductive.

In some embodiments, the mono-acid ester hybrid of the composition is a compound having the following formula:

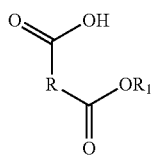

wherein R and R₁ are each independently selected from the group consisting of C1-C6 alkyl groups, C1-C6 aliphatic groups, and C1-C9 aromatic groups, any of which may be substituted with one or more functionalities that are substantially non-reactive to avoid cross-linking with other components of the composition.

In accordance with one or more embodiments, a semiconductor component may comprise a semiconductor chip with a solderable surface to provide one or more vertical interconnection pathways to a substrate with a solderable surface and an electrically conductive composition comprising at least one metal, a solder or solder alloy, a resin and a mono-acid ester hybrid comprising an unprotected, single reactive group at a first terminus and substantially non-reactive groups elsewhere such that the ester hybrid is functional as a chain terminator.

In accordance with one or more embodiments, a method of facilitating assembly of an electronic component may comprise providing a thermally and/or electrically conductive composition comprising a mono-acid ester hybrid, a resin, an anhydride and an effective amount of a metal to render the composition thermally and/or electrically conductive, wherein the mono-acid ester hybrid of the composition is a compound having the following formula:

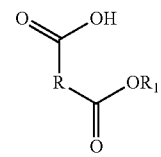

wherein R and R₁ are each independently selected from the group consisting of C1-C6 alkyl groups, C1-C6 aliphatic groups, and C1-C9 aromatic groups, any of which may be substituted with one or more functionalities that are substantially non-reactive to avoid cross-linking with other components of the composition.

In accordance with one or more embodiments, an electronic assembly may comprise at least one electronic component comprising a conductive composition comprising at least one metal, a solder or solder alloy, a resin and a mono-acid ester hybrid comprising an unprotected, single reactive group at a first terminus and substantially non-reactive groups elsewhere such that the ester hybrid is functional as a chain terminator. The assembly further comprises an overmold disposed on or around the electronic component, wherein the overmold is selected from the group consisting of an epoxy mold compound, a silicon encapsulant, a liquid epoxy encapsulant, glass, a transfer molded epoxy resin, and a liquid injected molded resin.

In accordance with one or more embodiments, an electronic package may comprise an electronic component comprising a conductive composition within a cavity package to protect the electronic component. The conductive composition may comprise at least one metal, a solder or solder alloy, a resin and a mono-acid ester hybrid comprising an unprotected, single reactive group at a first terminus and substantially non-reactive groups elsewhere such that the ester hybrid is functional as a chain terminator. The cavity package may comprise a lid that caps the package and is sealed to the cavity package via diffusion bonding or aniodic bonding using one or more materials selected from the group consisting of solder, glass, frit, and a polymer sealant.

In accordance with one or more embodiments, a method of depositing a conductive composition comprising at least one metal, a solder or solder alloy, a resin and a mono-acid ester hybrid comprising an unprotected, single reactive group at a first terminus and substantially non-reactive groups elsewhere such that the ester hybrid is functional as a chain terminator on a substrate is disclosed. The method may comprise dispensing the composition on the substrate, screen printing the composition on the substrate, stencil printing the composition on the substrate, jetting the composition on the substrate, or applying the composition on a wafer and drying the wafer.

Additional aspects, embodiments, examples and features are described in more detail below.

BRIEF DESCRIPTION OF FIGURES

Certain illustrative embodiments, features and aspects are described in more detail below with reference to the accompanying figures in which.

DETAILED DESCRIPTION

Figure 1:
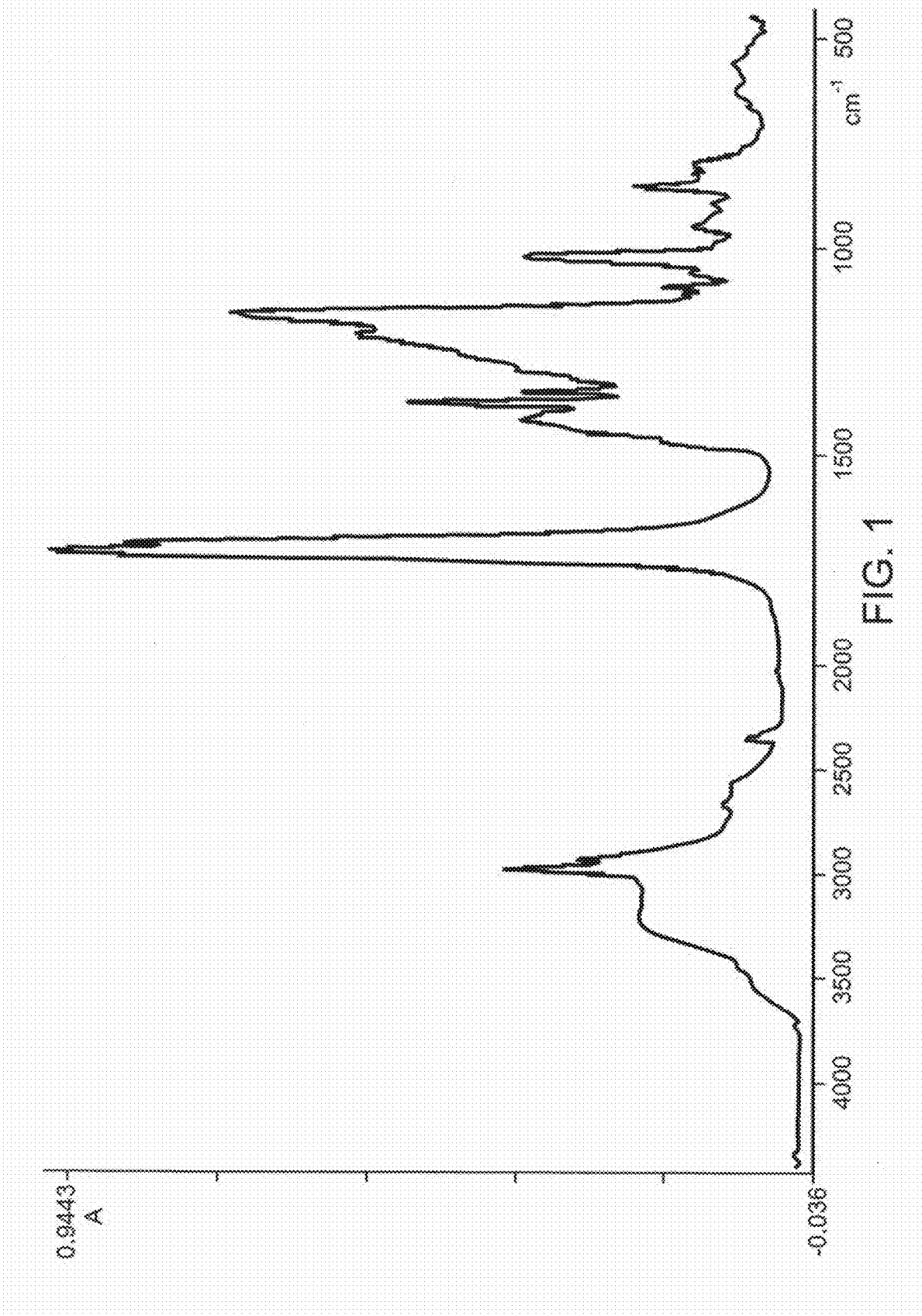
FIG. 1 is an IR spectrum of mono-ethylsuccinate, in accordance with certain examples.

Certain embodiments disclosed herein are directed to conductive compositions, e.g., thermally conductive, electrically conductive or both, that include, inter alia, a mono-acid hybrid. As used herein, the term "mono-acid hybrid," refers to a hybrid molecule that is used as a fluxing agent to remove oxide from metal powder and/or solder powder. The mono-acid hybrid includes an unprotected, single reactive group at a first terminus, i.e., is monofunctional, and substantially non-reactive groups elsewhere in the molecule. Due to the monofunctionality of the mono-acid hybrid and the non-reactivity of the other groups in the molecule, the hybrid is effective as a chain terminator and not a cross-linker. In some embodiments, The "free acid" of the mono-acid hybrid can result from the presence of a single carboxylic acid functional group, a single sulfonic acid functional group, or a single phosphonic acid functional group with at least one active proton that may be used to remove oxide from metal surfaces. In some examples, the mono-acid hybrid acid is saturated (no carbon-carbon double bonds or carbon-carbon triple bonds but may include keto-groups or other non-reactive groups having double bonds, for example, aromatic molecules) to prevent cross-linking through addition reactions (or other reactions) at the sites of unsaturation. In some non-limiting embodiments, the mono-acid hybrid is a mono-acid ester hybrid The mono-acid hybrids used in certain examples of the compositions disclosed herein differ markedly from those protected acids described in many existing patents including U.S. Pat. No. 5,376,403 (the '403 patent). In the '403 patent, the acids are protected to prevent premature cross-linking of a resin. Cross-linking of the resin can result in premature cross-linking and increases in viscosity that can reduce the working time of the composition. To avoid premature cross-linking in the compositions of the '403 patent and in related patents, the cross-linker is chemically protected to reduce the likelihood of premature cross-linking. Protection of the cross-linker requires addition of a protecting group to deactivate the cross-linker. Protection may occur by replacement of the hydrogen of the carboxylic acid group with an alkyl group or other non-reactive functionality. Protected acids require deprotection before the acids can function as a cross-linker. In addition, the cross-linkers of the '403 patent typically include more than a single reactive site to function as cross-linkers. In contrast to the cross-linkers of the '403 patent, certain embodiments disclosed herein advantageously utilize a mono-acid hybrid that functions as chain terminator. The use of a mono-acid hybrid can provide significant advantages over the cross-linkers of the '403 patent including, but not limited to, fewer steps as no protection of the acid is necessary, extended pot-life due to the lack of cross-linking from the mono-acid hybrid, low viscosity to permit higher metal loadings, reduced likelihood of sublimation, volatization or outgassing which reduces the overall voiding of the final structure, and the selection of mono-acid hybrids with high acid values per molecule weight of the hybrid provides for effective fluxing at low weight levels.

The compositions disclosed herein may be particularly useful in liquid phase sintering processes and devices produced using liquid phase sintering processes, such as the liquid phase sintering described, for example, in Shearer et al. "Transient Liquid Phase Sintering Composites." *J. Electronics Mat.*, 28, 1999, pp. 1319-1326, Palmer et al. "Forming High Temperature Soldering Joints Through Liquid Phase Sintering of Solder Paste." *J. Electronics Mat.*, 28, 1999, pp. 1189-1193, Palmer et al. "Forming Solder Joints by Sintering Eutectic Tin-Lead Solder Paste." *J. Electronics Mat.*, 28, 1999, pp. 912-915, German, Randall M. *Sintering Theory and Practice*. (1996), German, $R_1$, M. *Liquid Phase Sintering*. (1985) and German and Messing. *Sintering Technology*. 1996.

In certain embodiments, the compositions disclosed herein may further include a resin, an anhydride, catalysts, curatives and other components that may be desirable to produce a binder for use with a conductive material. In addition to being electrically conductive, the binder may also function as an adhesive or have adhesive properties. Illustrative compositions are discussed in more detail below. One or more components of the compositions may provide a binder that is effective to remove surface oxide layers from metal surfaces to facilitate good wetting and metal network formation. In some embodiments, the composition may include one or more of a mono-acid hybrid (which can act as a chain terminator), a latent catalyst (including but not limited to TPP, TPP-K, TPP-BQ), a monofunctional epoxy diluent with low ionic impurities (which can act as chain terminators), low mole equivalents of flux (which can reduce metal salt formation), a barrier coating to prevent or reduce oxidation of metal powder and/or prevent reaction of the mono-acid hybrid with the metal Most of electronic component assembly today is performed using soft solder wire, solder paste or highly silver filled thermosetting adhesives. These technologies are generally referred to as soft solder die attach or die attach adhesives. Die attach joining technology serves two general purposes to the end user; (1) is used transfer heat or electrical current from a semiconductor, discrete or LED chip to the substrate or heat sink; (2) provide mechanical attachment of the chip (which may include, for example, Si, GaAs, SiN or other semiconductor materials) to the substrate, where the attachment allows post processing such as wirebonding, additional chips to be stacked, and polymer encapsulation.

Solder wire, is a preferred technology approach for power semiconductor, power discrete and discrete applications due to the relatively high thermal conductivity of tin-lead based solders as well as good wetting to metallic surfaces leading to low contact or interfacial resistance. End users typically select SnPb based alloys due to their high melting point, more specifically they prefer alloys with melting points greater than 265° C., which is a common peak reflow temperature of lead free alloys common in board assembly of electronics such as mobile phones and televisions. It is desirable to that the die attach material does not melt and/or flow during the attachment of the component to a printed wiring board or circuit board (this attachment is commonly referred to as board assembly). Metal filled conductive adhesives do not reflow since the polymer network is cross linked with very limited mobility. However, solder alloys with melting points greater than 265° C., become liquid and can flow out of the joint causing shorts and lose mechanical strength that may compromise wire bond integrity. Several global initiatives have mandated elimination of lead from electronic assemblies, however, high lead solders are currently exempted since, at present day, no lead free die attach material exists that provides the required high thermal conductivity and no flow during lead free board assembly reflow conditions.

In some examples, the compositions are functional as a flux in that they can remove surface oxidation from the metal component to provide good overall conductivity. For example, the mono-acid hybrid component can remove oxides from metals. Unlike existing acids used in similar compositions, the hybrids used herein provide compositions that do not suffer from premature curing that occurs in compositions formed using acidic cross-linkers. Thus, the hybrid components described herein do not need any protecting groups to prevent cross-linking as no such cross-linking occurs.

Certain embodiments disclosed herein provide compositions that are room temperature stable and/or are suitable to render the product useful in high volume manufacturing environments for at least 8 hours. The compositions may be used, for example, to clean oxide from metal powders allowing the soldering of copper particles together during a heating profile. Further, the composition may react to reduce or eliminate corrosion problems commonly encountered by acidic residue.

In certain examples, the composition may include one or more of a mono-acid hybrid, a latent catalyst, a monofunctional epoxy diluent, a low mole equivalent of flux, and a barrier coating. As discussed herein by using a mono-acid hybrid that functions a chain terminator, the pot-life of the composition may be extended. Monofunctional epoxy diluents with low ionic impurities may be used and act in similar fashion as mono-acid hybrids as chain terminators to reduce cross-linking and thereby minimizing viscosity increases. A barrier coating may be used in the metals used in the compositions disclosed herein to prevent (1) oxidation of the metal powder, and/or (2) mono-acid hybrids from reacting with Cu or Sn metal. The barrier coating can be in form of polymer coating on the metal particle or a metal barrier coating, that in essence, is less prone to salt formation that the metal being coated. It is desirable that the polymer coating does not melt or dissolve in the organic media between −40° C. and +40° C. because this temperature range is a desirable storage and use temperature of the composition. The barrier metal may be selected from silver, gold, platinum, palladium, tin, nickel, indium or alloys thereof as a coating over the metal. In one embodiment, the metal may be copper or other metal that is susceptible to oxidation. Metal salts, more specifically copper salts, can catalyze the polymerization of epoxy resins which lead to high viscosity liquids and ultimately gelation. There are two implications of this uncontrolled polymerization: (1) viscosity increases at room temperature lead to thick or unusable product that does not easily dispense or spread; this viscosity increase most likely results in poor wetting of the composition which leads to poor adhesion, soldering and electrical and thermal transfer; and/or (2) dissolved metal salts influence rate of cure of the composition. It is preferred that the polymerization be controlled below the gel point of the polymer composition thereby allowing the molten solder to move freely and connecting copper particles together. In effect, if the polymer system builds molecular weight too quickly, and gels or hardens, then the molten solder can be immobilized and copper particles will remain discrete and no solder connection is made. This lack of connection results in poor thermal and electrical conductivities.

In accordance with one or more embodiments, a mono-acid hybrid may comprise an unprotected, single reactive group at a first terminus and substantially non-reactive groups elsewhere such that the mono-acid hybrid is functional as a chain terminator. In some embodiments, the mono-acid hybrid is a compound having the following generic formula (I) representative of mono-acid hybrids suitable for use in the compositions disclosed herein.

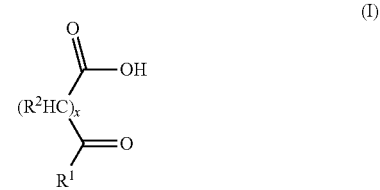

(I)

wherein X equals 1 to 9 and $R^1$ and $R^2$ are each independently selected from the group consisting of H, C1-C6 alkyl groups, C1-C6 aliphatic groups, C1-C6 alkoxy groups, and C1-C9 aromatic groups, any of which may be substituted with one or more functionalities that are substantially non-reactive to avoid cross-linking with other components of the composition. In certain examples, the $CHR^2$ group between the two carbonyl groups may take the form of a cyclic ring such as, for example, cyclobutane, cyclopentane or cyclohexane. In such instances, two of the $CHR^2$ groups would instead be CH groups to provide the proper tetra-valency for the ring carbons. In some examples, $R^1$ may be selected from methyl, ethyl, propyl and other saturated alkyl chains, for example, aliphatic or branched alkyl chains, having between one and six carbon atoms. The groups selected for $R^1$ may be substituted with one or more heteroatom containing groups including, but not limited to, tertiary amines or other groups including a heteroatom and being substantially non-reactive. The mono-acid hybrid of formula (I) may be selected such that the carboxyl group of formula (I) is generally the only reactive site in the molecule. Thus, no substantial cross-linking occurs using the molecule of formula (I) but instead, formula (I) functions as a chain terminating agent that controls the MW of the polymer. The mono-acid hybrid can function as a fluxing agent to remove oxide from metal powder and/or solder powder. In particular, the proton of the carboxyl group may provide active protons used to remove the oxide from metal surfaces. The mono-acid hybrids are monofunctional and operative as chain terminators to extend the overall pot life of the compositions. A composition that includes an unprotected liquid multifunctional carboxylic acid (i.e. capable of cross linking), a difunctional epoxy, an anhydride, a copper powder, and a solder powder rapidly increases in viscosity and becomes too thick to mix after 60 minutes. The same formulation with the mono-acid hybrid results in no viscosity increase (or very minimal). Using standard titration techniques with a base indicator indicates the mono-acid hybrid provides acid values. In at least one embodiment, the mono-acid hybrid is Levulinic acid. The Levulinic acid may have an acid value of about 460 mg KOH/gram.

In accordance with one or more embodiments, the mono-acid hybrid may be a mono-acid ester hybrid. In some embodiments, the mono-acid ester hybrid comprises a single, unprotected carboxyl group that can function as a free acid to donate protons. Generic formula (II) is representative of mono-acid ester hybrids suitable for use in the compositions disclosed herein.

(II)

In formula (II), the mono-acid ester hybrid include a single free acid group (—COOH) and an ester group connected to each other through an R group. The mono-acid ester hybrids are unprotected throughout the reaction, which reduces the numbers of steps used to provide the compositions and simplifies production of the compositions. The mono-acid ester hybrid can function as a fluxing agent to remove oxide from metal powder and/or solder powder. In particular, the proton of the carboxyl group may provide active protons used to remove the oxide from metal surfaces. The mono-acid ester hybrids are monofunctional and operative as chain terminators to extend the overall pot life of the compositions. By way of example, when a mono-acid ester hybrid is added to a copper powder, a blue-green color results within about an hour which indicates fluxing action at room temperature. A composition that includes an unprotected liquid multifunctional carboxylic acid (i.e. capable of cross linking), a difunctional epoxy, an anhydride, a copper powder, and a solder powder rapidly increases in viscosity and becomes too thick to mix after 60 minutes. The same formulation with the mono-acid ester hybrid results in no viscosity increase (or very minimal). Using standard titration techniques with a base indicator indicates the mono-acid ester hybrid provides acid values.

In certain embodiments, the compositions disclosed herein may include a mono-acid ester hybrid that includes a carboxyl group, an ester group, and a selected number of atoms between them. A generic formula of one mono-acid ester hybrid is shown below as formula (III)

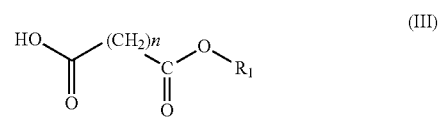
(III)

In formula (III), n may vary and is typically one to twelve, more particularly, one to nine, for example, one to six or one to three. In certain examples, the $CH_2$ group between the two carbonyl groups may take the form of a cyclic ring such as, for example, cyclobutane, cyclopentane or cyclohexane. In such instances, two of the $CH_2$ groups would instead be CH groups to provide the proper tetra-valency for the ring carbons. In some examples, $R_1$ may be selected from methyl, ethyl, propyl and other saturated alkyl chains, for example, aliphatic or branched alkyl chains, having between one and six carbon atoms. The groups selected for $R_1$ may be substituted with one or more heteroatom containing groups including, but not limited to, tertiary amines or other groups including a heteroatom and being substantially non-reactive. The mono-acid ester hybrid of formula (III) may be selected such that the carboxyl group of formula (III) is generally the only reactive site in the molecule. Thus, no substantial cross-linking occurs using the molecule of formula (III) but instead, formula (III) functions as a chain terminating agent. The use of such chain terminating agents provides unexpected advantages and results, as compared to compositions using cross-linking agents, including, but not limited to, lower viscosities, less likelihood of premature curing, permission of higher conductive material loading rates due to a more open network, less void formation due to decreased carbon dioxide evolution and the like.

In certain embodiments, the mono-acid ester hybrid may be produced by reacting an anhydride with an excess of an alcohol. In certain examples, the alcohol that is reacted with the anhydride may be methanol, ethanol, propanol, isopropanol, butanol, sec-butyl alcohol, t-butyl alcohol or other alcohols having one to six carbon atoms. In some examples, the alcohol is a saturated alcohol. The alcohol is typically an alcohol comprising a single OH group and not a diol or polyol. The exact anhydride that is reacted with the alcohol may vary, and in some examples, the anhydride is one or more of succinic anhydride, 2,2-dimethylglutaric anhydride, 2,2-dimethylsuccinic anhydride, ethanoic anhydride, propanoic anhydride, butanoic anhydride, pentanoic anhydride, hexanoic anhydride, heptanoic anhydride, octanoic anhydride, nonanoic anhydride, decanoic anhydride, dodecanoic anhydride, methylhexahydrophthalic anhydride (MHHPA) or other suitable aliphatic or cyclic saturated anhydrides. The exact number of atoms in the anhydride may be selected to vary the overall network of the compositions. For example, it may be desirable to react the alcohol with an anhydride having more carbon atoms to provide a less densely packed binder, whereas in other examples, an anhydride having fewer carbon atoms may be used to provide a binder with closer packing.

In a particular embodiment, a mono-acid ester hybrid may be produced by reaction of succinic anhydride with excess ethanol as shown in the reaction scheme below.

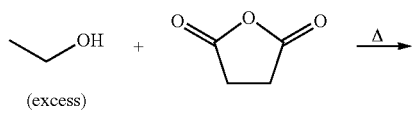
(excess)

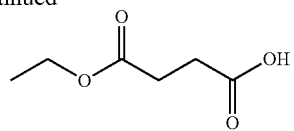

The mono-acid product may be produced, for example, using heterogeneous and homogeneous catalysis as described, for example, by Nandhini et al., J. Mol. Cat. A: Chem, vol. 243, 2006, pp. 183-193, and Bart et al., Int. J. Chem. Kin, vol. 26, 1994, pp. 1013-1021. However, catalysis is not required. In particular, large quantities of mono-ethyl succinate may be produced through the elevated temperature alcoholysis of succinic anhydride without the use of catalysis, using an excess of ethanol as shown in the reaction scheme above. The excess ethanol may be subsequently removed from the reaction mixture under reduced pressure.

In some embodiments, amide esters (or other nucleophilic groups) may be used with, or in place of, the mono-acid ester hybrid, as shown in formula (IV) below.

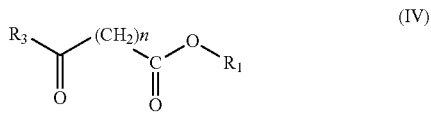

In formula (IV), $R_3$ may be $-NH_2$, $-SH$, $-OH$ or other suitable nucleophilic groups or leaving groups depending on the desired reaction of the molecule. $R_1$ may be any of those groups discussed above in reference to formulae (II) or (III), and n may vary and is typically one to twelve, more particularly, one to nine, for example, one to six or one to three.

In certain examples, the compositions disclosed herein may also include a reactive monomer or polymer which, in some examples, may take the form of an anhydride that may be combined with the mono-acid hybrid and/or the metal. In some examples, the anhydride may be selected from (2-dodecen-1-yl)succinic anhydride, (2-nonen-1-yl)succinic anhydride, 1,8-naphthalic anhydride, methyl hexahydrophthalic anhydride, tetrahydrophthalic anhydride, nadic methyl anhydride, alkenyl succinic anhydride, 2,3-dimethylmaleic anhydride, 3-hydroxyphthalic anhydride, 4-methylphthalic anhydride, dimethylmaleic anhydride, diphenylmaleic anhydride, or other suitable anhydrides. Because of its rigid bicyclic structure, nadic methyl anhydride yield polymers with higher glass transition temperatures. Alkenyl succinic anhydrides impart lower moisture absorption and a lower glass transition temperature to the polymer because of their long aliphatic chain. The exact number of atoms in the anhydride may be selected to vary the overall network of the compositions. For example, it may be desirable to use anhydrides having more carbon atoms to have a more open polymer network with more void volume, whereas in other examples, an anhydride having fewer carbon atoms may be used to provide a binder with closer packing. In some examples, the anhydride may include about three to about twelve carbon atoms, more particularly about four to about eight carbon atoms, for example about five to about seven carbon atoms. Similarly, the degree of unsaturation in the anhydride may be selected to promote cross-linking or deter cross-linking, with higher degrees of unsaturation favoring increased levels of cross-linking.

In certain embodiments, the compositions disclosed herein may include one or more metals. The exact form of the metal added to the composition may vary and in certain examples the metal may be a powder, for example, a sintered or unsintered powder, a salt, particles, nanoparticles, for example capped or uncapped nanoparticles, flakes, for example with a lubricant, or other forms that metals may take such as those described, for example, in WO2008017062. As used herein, capped metal particles refer to those that include an organic moiety functionalized to the metal group, whereas coated metal particles refer to those where one or more other materials has been deposited in some manner on the metal but there is not necessarily any chemical bond between the metal and the deposited material. In certain examples, the metal may take the form of silver coated copper, tin coated copper or antimony coated copper. By coating the copper with silver or another protective material, surface oxidation of the copper may be greatly reduced and overall conductivity may be improved. Thus, in some embodiments, the metal may be coated with an antioxidant material such as, for example, those materials commonly used to reduce, resist or inhibit oxidation, e.g., polymer coatings. In other examples, metal may be capped or coated with a thermoplastic resin, a solid thermosetting resin, or a self assembly monolayer. Illustrative examples of suitable thermoplastic resins include, but are not limited to, polyimides (PI), siloxane polyimides (SPI), polysulfone (PS), polyphenyl sulfone, polyethersulfones (PES, PESU), polyarylene ethers (PAE), phenoxy resins, polyetheretherketone (PEEK) polyesters (PE), polytetrafluoroethylene (PTFE), Polyamides (PA), polyoxymethylene (POM), polybutylene terephthalate (PBT), liquid crystal polymers (LCP), crosslinked silicones, and polyurethanes (PU). Illustrative examples of suitable solid thermosetting resins include, but are not limited to, epoxy resins, phenolic epoxy resins, cresol novalic epoxy resins, cycloaliphatic epoxy resins, naphthalenic epoxy resins, dicyclopentadiene epoxy resins, biphenyl epoxy resins, epoxidized silicon resins, maleimide resins, bismaleimide resins, cyanate ester resins, dicyanate ester resins, benxozazine resins, acrylate resins, methacrylate resins, polyolefin resins, functionalize polyurethanes, polybutadiene resins, functionalized polybutadiene resins, carboxy-terminated butadiene-acrylonitrile (CTBN). Illustrative examples of materials that can form self assembling monolayers include, but are not limited to, a triazole, a benzotriazole, a benzamidizole, an imidizole, or an organic acid. In some examples, a majority of the weight of the compositions is from the metal. For example, the weight percent of the metal, based on the weight of the composition, may be greater than 50%, greater than 75% or even greater than 90% or 95% such that the overall composition is highly electrically conductive.

In certain embodiments, the exact metal used may vary and includes, but is not limited to, silver coated copper, copper, silver, aluminum, gold, platinum, palladium, rhodium, nickel, cobalt, iron, molybdenum and alloys and mixtures thereof. In embodiments where the metal is provided, at least in part, by including a solder in the composition, the solder may include, but is not limited to, tin, bismuth, lead, zinc, gallium, indium, tellurium, mercury, thallium, antimony, selenium and mixtures and alloys thereof. In some examples, a first metal and a second metal may be used. In certain examples, the melting points of the two metals may differ with the amount of each metal selected to provide a desired conductivity and/or desired physical properties to the overall composition.

In certain examples, the metal used in the compositions disclosed herein may be provided in more than one form. For example, metal powder may be mixed with a metal alloy solder to provide different types of metals in the composition. Thus, the source or type of metal in the compositions may be different and may vary. For example, the metals in the composition may be, for example, silver coated copper in combination with a tin-bismuth or a SnAgCu solder alloy.

In certain embodiments, the compositions disclosed herein may also include a resin such as, for example, an epoxy resin. Illustrative epoxy resins include, but are not limited to, low viscosity liquid epoxies of particular interest include epoxidized bisphenol F, epoxidized bisphenol A, cycloaliphatic epoxies, naphthalenic epoxy Epiclon® HP-4032D (DIC, Japan), and multifunctional epoxy MY-0510 (Huntsman, USA). The bisphenol A and F resins are low viscosity, thus allowing for higher metal loadings, and yield polymers with low-to-moderate glass transition temperatures ($T_g$'s). Naphthalenic epoxy HP-4032D gives a higher $T_g$ and is reportedly more hydrolysis resistant, but its viscosity is also considerably higher. Cycloaliphatic and multifunctional epoxy MY-0510 can potentially provide both low viscosity and $T_g$'s.

In some examples, the compositions disclosed herein may also include one or more carboxylic acids. In certain examples, a carboxylic acid having the following properties may be selected: 1) low viscosity and 2) low equivalent weight (high acid values). This presents a challenge, in that most of the low-molecular weight aromatic monocarboxylic acids (benzoic, phenyl acetic acid etc.,) and the aliphatic dicarboxylic acids typically used in flux formulations (glutaric, succinic and adipic acid) are crystalline solids with melting points less than or equal to 80° C. When used in the compositions disclosed herein, these materials can act to increase the viscosity.

In certain embodiments, a stoichiometric mixture of epoxidized bisphenol F resin, with MHHPA and a generic carboxylic acid may be used in the compositions disclosed herein. An illustrative combination of these materials and an illustrative product is shown below.

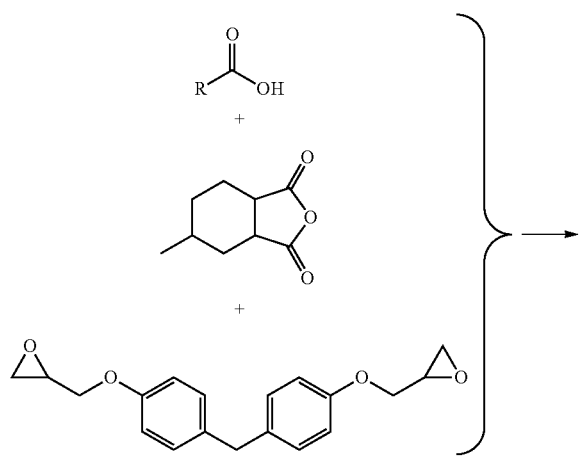

-continued

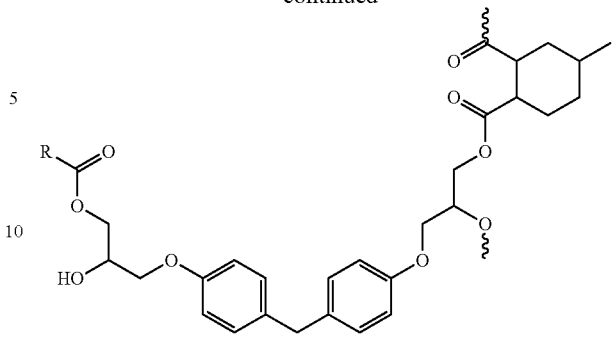

Illustrative weight percentages for the components used in the compositions disclosed herein are discussed in more detail below.

In certain embodiments, the compositions disclosed herein may be used in a liquid phase sintering (LPS) process to provide materials suitable for use in preparing electrical devices and/or joints between components in an electrical device. In liquid phase sintering, the liquid phase exists for a short period as a result of the homogenization of the metals in the composition. For example two or more different metals may be selected which exhibit a eutectic point or melt at some composition and at some temperature $T_1$. A mixture of the two metals may be prepared in the proportion of the desired final, the final composition being a solid at $T_1$. Heating of the mixture to $T_1$ results in the formation of a liquid phase. The liquid phase has a very high solubility in the surrounding solid phase, thus diffusing rapidly into the solid and eventually solidifying at temperature $T_1$. Diffusional homogenization provides a final composition without the need to heat the mixture above its equilibrium melting point. LPS may be used in the compositions disclosed herein to provide a material that includes a metal and a binder system. The material may be used in forming electrical joints, conductive paths or other suitable structures in electrical devices including, but not limited to, printed circuit boards. In some examples, the viscosity of the material may be selected such that printed circuits may be provided by depositing a desired pattern on a substrate and then sintering and/or curing the deposited pattern. During heating, the binder material is operative as a flux for the metal(s), which permits the liquid phase sintering process to occur. After heating, the binder can bind any resulting oxides.

In certain examples, one or more solvents, catalyst, additives, diluents and the like may be used with or in preparing of the compositions described herein. The exact solvent or solvents selected may depend, at least in part, on the desired viscosity of the mixture and the desired solubility of the components in the solvent. Suitable solvents include, but are not limited to, ketones, acetates, esters, lactones, alcohols, ethers, polyethers, glycol ethers, glycol ether esters, hydrocarbons, aromatic solvents, alkylaryl ethers and terpenes. More specifically, acetone, methyl ethyl ketone, cyclohexanone, ethanol, propanol, butanol, butyl ether, dibasic esters, 4-butyrolactone, carbitol acetate, butyl carbitol acetate, and propylene glycol monomethyl ether acetate (PM acetate). Additional suitable solvents will be readily selected by the person of ordinary skill in the art, given the benefit of this disclosure and based on the particular materials selected for use in the composition. Illustrative latent catalysts such as, for example, TPP, TPP-K, TPP-BQ are described herein. Exemplary monofunctional diluents include, but are not limited to, those described herein.

In certain embodiments where the composition includes a mono-acid hybrid, an epoxy resin, an anhydride and at least one metal, the weight percentages of the components, based on the weight of the composition may vary as follows: about 0.5% to about 10% by weight mono-acid hybrid, about 2% to about 10% by weight epoxy resin, about 0.5% to about 8% by weight anhydride, and about 80% to about 95% by weight metal. In embodiments where the composition includes a metal, a solder, a resin, a mono-acid hybrid, and an anhydride, the weight percentages of the components, based on the weight of the composition may vary as follows: about 80% to about 95% by weight metal, about 35% to about 65% by weight solder, about 2% to about 10% by weight resin, about 0.5% to about 10% by weight mono-acid hybrid, and about 0.5% to about 8% by weight anhydride. In embodiments where the composition includes a metal and an organic binder, the weight percentages of the components, based on the weight percent of the composition may be about 80% to about 95% by weight metal and 5% to about 20% by weight binder. Where the binder itself includes an epoxy resin, an anhydride, and an mono-acid hybrid, the weight percentages of the components in the binder, based on the weight of the binder, may vary as follows: about 20% to about 90% by weight resin, about 0% to about 45% by weight anhydride, and about 5% to about 40% by weight mono-acid hybrid. Additional weight percentages may be used depending on the desired properties of the material.

In certain embodiments, the compositions disclosed herein may include additional components, additives, curatives, catalysts and the like. In some examples, at least one additional component or material that include one or more reactive moieties selected from an epoxy group, an amine group, an amide group, an alcohol group, an alkenyl group, an allyl group, an acrylate, a methacrylate, a cyanate ester and a maleimide may be used in the compositions disclosed herein. Catalysts such as imidazole, phosphines, phosphates, amide, phenols, metal salts including, but not limited to, metal carboxylates or acetoacetenoate metal complexes such as, for example organo-tin complexes and the like may be used. Initiators such as peroxides may be also added. Viscosity modifiers may be included in some examples.

In certain examples, the compositions disclosed herein may be used in electronic components where thermal and/or electrical conductivity may be desired between the semiconductor chip and a substrate or heat sink. For example, the compositions may be used to provide a thermal and/or an electrical path between a semiconductor chip and a substrate or heat sink. In some examples, a device comprising at least three layers wherein at least one of the layers comprises one or ore of the compositions disclosed herein is provided. For example, the device may include a bottom layer, an interconnect layer comprising the conductive composition and a top layer. One or more thermal and/or an electrical connections may be provided between the top and bottom layers through the interconnect layer that includes one or more of the compositions disclosed herein. For example, the top may include one or more semiconductor chips or other electrical devices that may be produced, for example, by semiconductor wafer fabrication techniques on, for example, a Si, GaAs, or SiC wafer. The bottom layer may be comprised of flexible or rigid, polymer, composite, ceramic or a metal substrate or other suitable materials. In some layers, a composition as disclosed herein that has been deposited and cured into a simple or complex pattern onto a suitable substrate provides adhesion between the bottom layer and the top layer and may also provide the thermal and electrical interconnection between the bottom of the chip that is coated with a solderable metal to the metal lead frame or substrate. In some examples, the compositions may be used to provide specialized connections such as die attach solder or adhesive or the like.

In other examples, the compositions disclosed herein may be used to provide a thermal connection between a flip chip die mounted on an organic or ceramic substrate with one or more areas or layers to a metal heat sink. For example, an interconnect produced using one or more of the compositions disclosed herein may provide a thermal path between a surface mounted die and a metal heat sink. In other examples, one or more of the compositions disclosed herein may be deposited on a top of the flip chip die that has a solderable surface, followed by placement of a lid on the deposited material, and after curing, a thermal connection may be provided between the die and the top layer or metal heat sink.

The adhesive characteristics of the compositions disclosed herein may also be used to retain the die to a desired surface. For example, an electronic component may be produced that includes an attached die, where the assembly includes a via interconnect layer which has one or more of the electrically conductive compositions disclosed herein patterned into suitable dielectric materials. In some examples, the suitable dielectric materials provide adhesion between the substrate and a component or die while the electrically conductive compositions provide the electrical interconnection and adhesion between connecting pads of substrate and the attached semiconductor chip.

In certain embodiments, a method of assembling an electronic component comprising disposing a middle layer comprising at least one of the compositions disclosed herein on a bottom layer and disposing a top layer on the middle layer is provided. The overall assembly may be further processed, for example, subjected to curing, sintering, a reflow or rework operation or the like, or additional components including, but not limited to, dies may be attached to the top layer or the bottom layer. Additional layers or material may be deposited to provide a multi-layer printed circuit board.

In an illustrative method, an electronic component with at least one vertical interconnect, produced using one or more of the compositions disclosed herein, may include a single chip or multiple chips, on the same planar surface, or attached vertically. One or more of the compositions disclosed herein may then be applied by a variety of techniques, such as dispensing, stencil printing, screen printing, jetting, stamping, doctor blading, curtain coating, or, again, by other methods known to those skilled in the art, onto each of these substrates in a desired pattern, each layer being the same or different from other layers. The compositions may then be cured, or simply dried and left uncured while the thin substrates are aligned and bonded together under pressure. The bonding pressure can force the conductive layers to interconnect the substrates, interconnection being made wherever the aforementioned conductive composition within the contacts circuit pads of the same adhesive composition on either side. Curing of the composition may be done before, during or after this bonding process. The result is a multi-layered electronic component.

When the compositions disclosed herein are used in preparing printed circuit boards, the cure temperature may range from about 220° C. to about 290° C., more particularly about 255° C. to about 285° C., for example, about 265° C. to about 275° C. Suitable dielectric materials for use include, but are not limited to, polyimides, copper clad polyimides, and similar materials.

In certain examples, the compositions disclosed herein may be used in a method of assembling an electronic component comprising a multilayer assembly. In certain examples, the method may comprise disposing one or more of the compositions disclosed herein in a layer between a top layer and a bottom layer to provide a thermal and/or electrical pathway between at least two non-adjacent layers in the electronic component.

In some examples, a method of facilitating assembly of an electronic component is provided. In certain examples, the method comprises providing one or more of the compositions disclosed herein optionally with instructions for using the composition. In some examples, a kit including a composition and instructions for using it may also be provided.

In certain examples, a composition that has been cured is provided. In some examples, the composition may include any one or more of the compositions described herein for example, a cured form of a composition comprising a mono-acid hybrid that is functional as a chain terminator, an epoxy resin, an anhydride, and an effective amount of at least one metal to render the composition electrically conductive. In other examples, the cured composition may be a cured form of a composition comprising a metal, a solder or solder alloy, a resin, a mono-acid hybrid that is functional as a chain terminator, and an anhydride. In yet other examples, the cured composition may be a cured form of a composition a metal, and an organic binder comprising an epoxy resin, an anhydride, and a mono-acid hybrid that is functional as a chain terminator. In some non-limiting embodiments, the mono-acid hybrid may be a mono-acid ester hybrid.

In certain embodiments, the compositions disclosed herein may be used on a wafer level. For example, pre-applying one or more of the compositions to a wafer or substrate followed by drying or partial polymerization (b-staging) may be performed. The composition may include, for example, a solid thermosetting resin that can provide a tack free surface after drying or b-staging. In addition, the b-staging could be controlled by selecting resin types that have different cure kinetics. The intent is to cure (i.e., cross-link) only a portion of the organic binder such that it yields a tack free surface that allows the end user easy handling. The unreacted or latent resin is soft and can provide an adhesive bond with the aid or heat, pressure or both. The composition may alternatively, or in addition, include a solid mono-acid hybrid molecule, for example, a solid mono-acid ester hybrid molecule, to aid in creating a tack-free composition on the wafer or substrate. Once the composition is deposited on the wafer or substrate, it may be stored under ambient conditions. It may be desirable for the metal powders to be coated or encapsulated by a noble metal that does not easily oxidize or an organic or polymer coated metal particle such that the organic or polymer coating, melts, vaporizes, dissolves and dissociates allowing solder to metal bonding. It is also desirable that the composition has sufficient mechanical properties after drying or b-staging such that the wafer or substrate can be easily diced or singulated without chipping the composition or gumming the dicing blade. The composition may also contain thermoplastic resin that provides sufficient mechanical strength during the wafer level process.

In certain embodiments, the compositions disclosed herein may be used in or with an electronic assembly comprising at least one electronic component that includes an overmold disposed on or around the electronic component. In some examples, the electronic component is a semiconductor component. In other examples, the overmold can be selected from the group consisting of an epoxy mold compound, a silicon encapsulant, a liquid epoxy encapsulant, glass, a transfer molded epoxy resin, and a liquid injected molded resin or other suitable compounds that can provide protection from heat, the environment or other conditions in a use environment.

In certain examples, an electronic package comprising an electronic component comprising one or more of the compositions described herein within a cavity package to protect the electronic component is disclosed. In certain embodiments, the cavity package may include a lid that caps the package. In some examples, the lid can be sealed to the cavity package using one or more materials selected from the group consisting of solder, glass, frit, and a polymer sealant. In other examples, the lid can be sealed to the cavity package using diffusion bonding, aniodic bonding or other processes to attach or bond the lid to the package.

In certain embodiments, a method of depositing at least one of the compositions described herein on a substrate comprising dispensing the composition, screen printing the composition, stencil printing the composition, jetting the composition, or the like, on the substrate is disclosed. The printing or depositing may be performed manually or using automated printing devices. The viscosity of the composition may be adjusted using a viscosity modifier or diluent to facilitate the selected mode of deposition.

In some embodiments, a method comprising applying one or more of the compositions described herein to a wafer is provided. In some examples, the wafer may be dried and/or the composition may be polymerized. Additional steps including, but not limited to, further processing of the wafer may also be performed. For example, a semiconductor component (or other electronic component), including wire bonds and interconnects may be further protected by encapsulation using a transfer molded epoxy resin, liquid injected molded resin, a liquid encapsulant, a silicon encapsulant or other suitable materials. The semiconductor may also be further protected by packing in a closed environment of a lidded cavity package, as described herein.

Certain specific examples are described below to further illustrate some of the novel features of the technology described herein.

Example 1

A mono-acid ester hybrid was prepared by reacting an excess of ethanol with succinic anhydride at a temperature of 165° C. followed by vacuum evaporation of any residual ethanol. An IR spectrum (smear on a KBr plate) of the resulting mono-ethyl succinate is shown in FIG. 1. In addition to an acidic —OH stretch at about 3350 cm$^{-1}$, the material is characterized by both a ester-carbonyl (1735 cm$^{-1}$) and a acid-carboxyl stretch (1714 cm$^{-1}$).

Example 2

A composition was prepared that included 88% by weight of metal and using the mono-acid ester hybrid from Example 1. When normalized for the metals content, the mixture consisted of copper powder (30-60%), SAC alloy (0-35%), SnBi (0-35%) and silver flake (0-10%).

Figure 2:
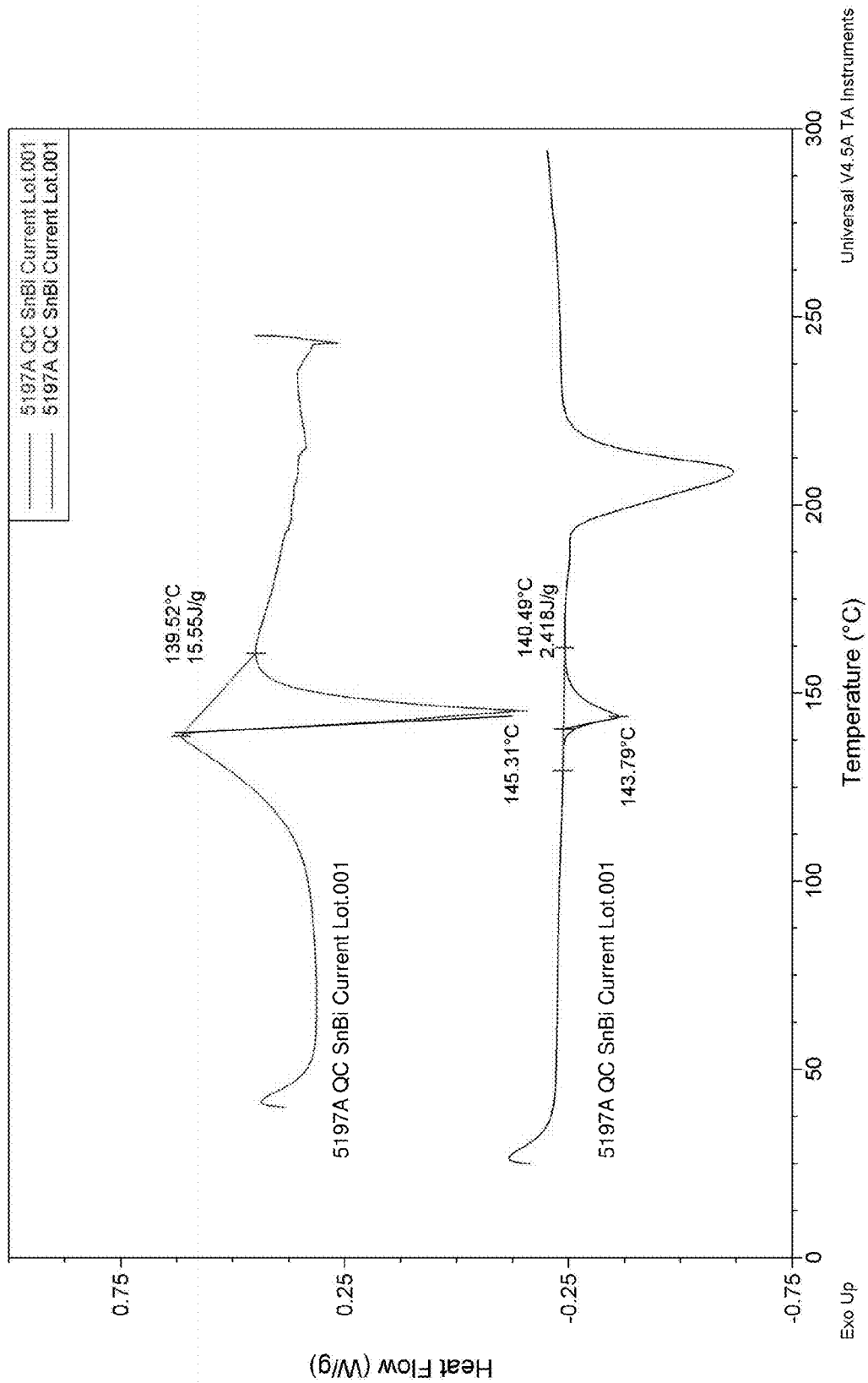
FIG. 2 shows the results of differential scanning calorimetry analysis on a composition, in accordance with certain examples.

The organic binder/flux system consisted primarily of epoxidized bisphenol F as the epoxy (50-60%), MHHPA (24-30%) as the anhydride and mono-ethyl succinate (14-22%) as the acid. Using a standard imidazole catalyst, the ratio of epoxy to hardener (anhydride+acid) was maintained at stoichiometric balance (1:1), but the acid/anhydride molar ratio was varied from 0.2 to 0.8. After blending, the mixtures were analyzed in a differential scanning calorimeter using a multi-step dynamic profile (heat-cool-heat) from 25-300° C., 20° C./min ramp rate. The ratio of the melt enthalpy of the SnBi solder ($T_{melt}$~145° C.) during the $2^{nd}$ heat cycle, divided by the melt enthalpy during the $1^{st}$ heat cycle, was used as a quantitative measure of solder alloy conversion and hence fluxing activity (Equation 1 and FIG. 2).

$$\% \text{ conversation} = 100 \cdot \left(1 - \left[\frac{\Delta H_2}{\Delta H_1}\right]\right) \quad (1)$$

The measured composition included 88% metal content (35.2% SnBi, 52.8% Cu), and 60 mol-% acid in the hardener. The initial melt enthalpy of the pure SnBi alloy was about 57 J/g, which, at a 32.5% loading would give ΔH=19 J/g. The observed ΔH value of 15.5 J/g is lower due to a partial superposition of the polymerization exotherm. The percent conversion is calculated as 100*(1−[2.4/19.0])≈87%. The peak appearing at ~208° C. in the $2^{nd}$ heating cycle is attributed to formation of a new, high-melting metal alloy.

Starting from the known equivalent weights of epoxy (162 g/mol), anhydride (168 g/mol) and mono-acid ester hybrid (146 g/mol), assuming an average density of 1.0 g/cm³ for the organic phase (12% by weight) and an average density of the metals of approximately 9.0 g/cm³ (88% by weight), it is useful to convert from mole-% acid in the organic hardener portion to moles-acid/cm³ in the fully-formulated LPS. With 88% metal loading, the approximate density of the LPS is:

$$= \frac{1}{\left(\frac{0.12}{1.0}\right) + \left(\frac{0.88}{9.0}\right)} = 4.59 \text{ g/cm}^3$$

Within this unit volume, there is 0.12×4.59 g of organic binder≈0.55 g. In the case of 40 mol-% mono-ethyl succinate acid in the hardener, the weight (and volume) fraction of mono-acid ester hybrid in the organic portion is:

$$= \frac{0.4 \cdot 146}{0.4 \cdot 146 + 0.6 \cdot 168 + 1.0 \cdot 162} = 0.182$$

Figure 3:
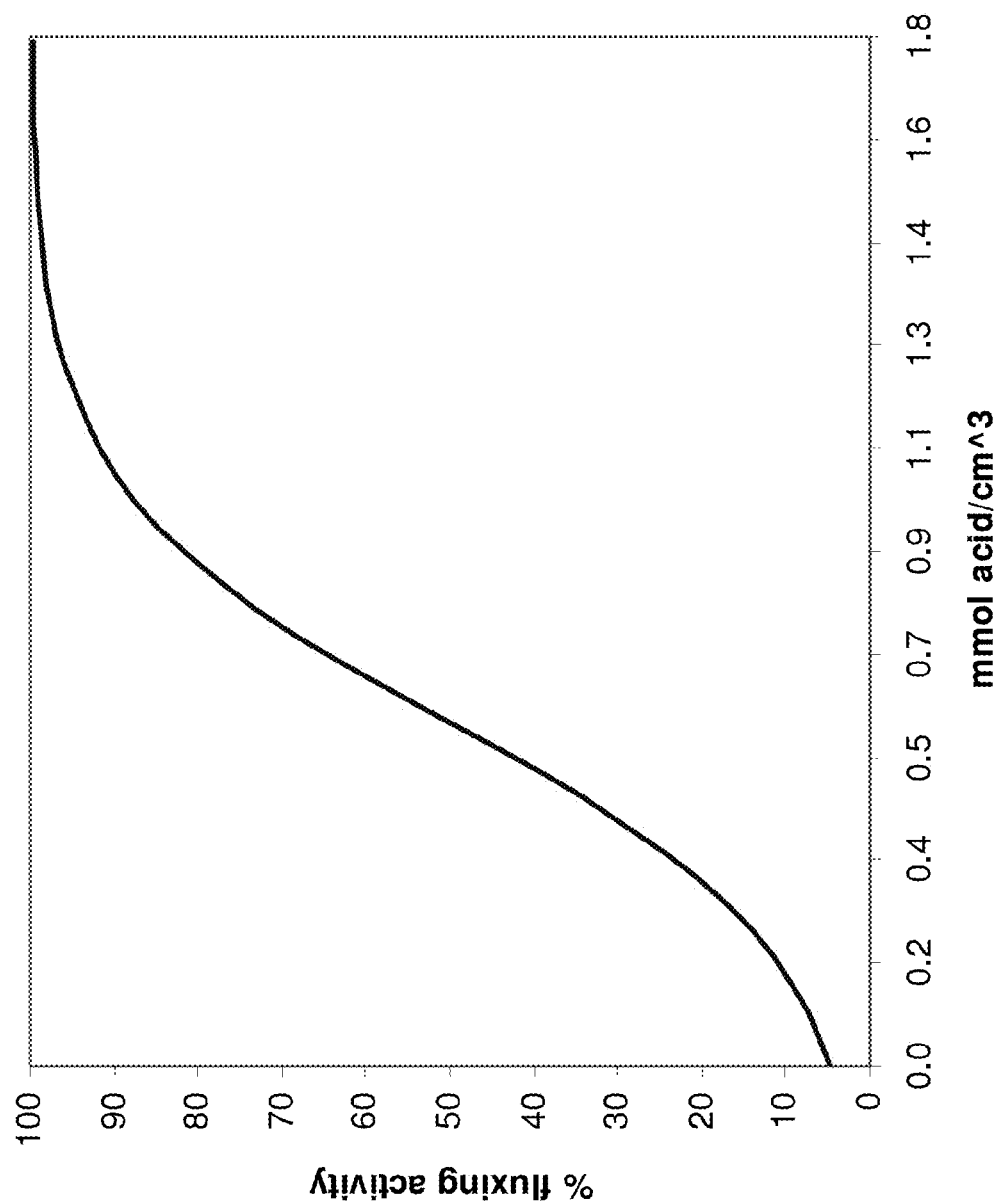
FIG. 3 is a graph showing the relationship between percent fluxing activity and millimoles of acid/cubic centimeter, in accordance with certain examples.

The amount of acid per unit volume is therefore 0.182×0.55 g=0.10 g or 0.10 g/146 g mol$^{-1}$=0.687 mmol/cm³. For 100 mol-% acid as the hardener, the amount of acid rises to 1.79 mmol/cm³. From the DSC experiments, the general trend in % conversion vs. acid is shown in FIG. 3.

Example 3

Cure Kinetics and Reflow Profile

Figure 4:
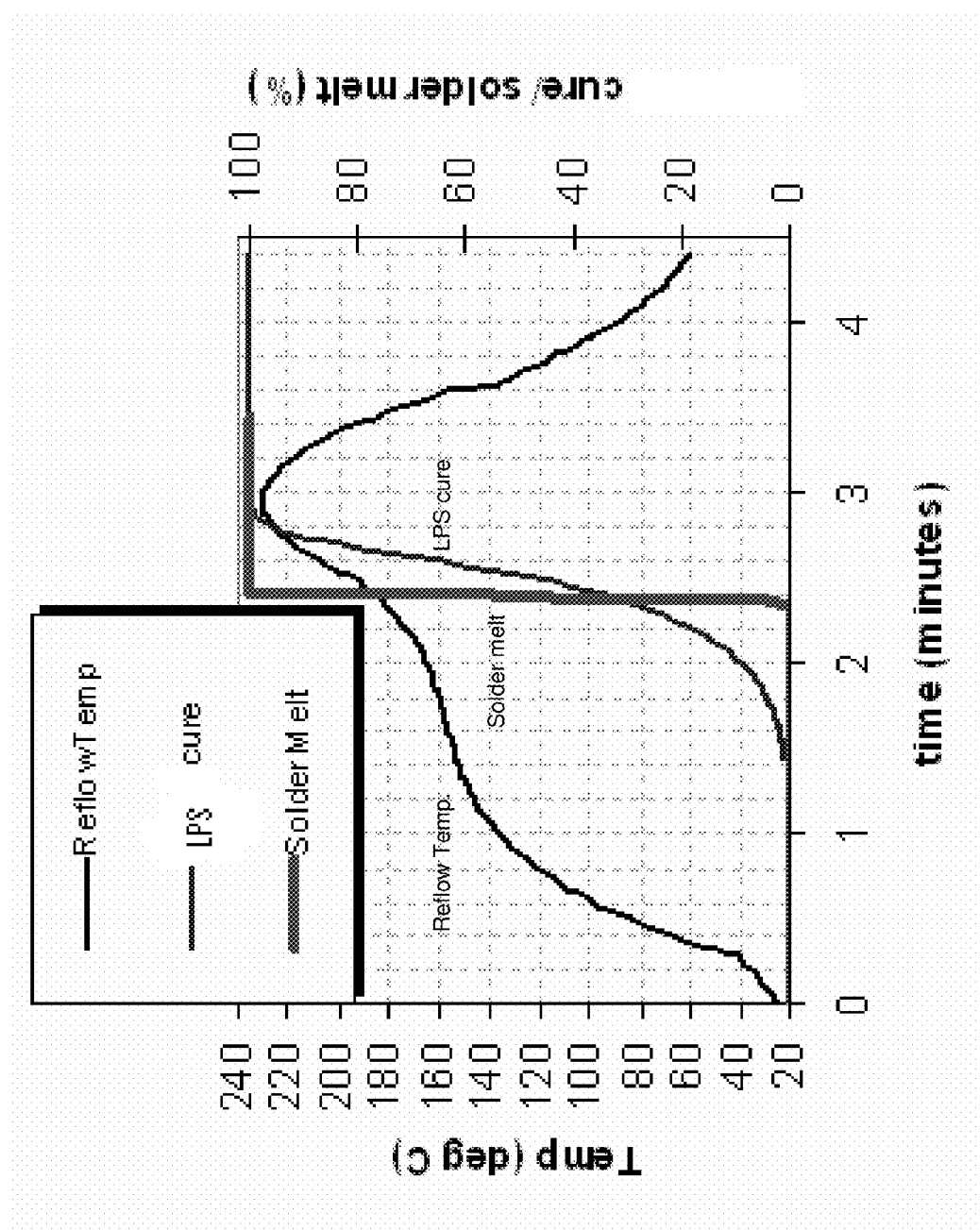
FIG. 4 shows a time profile as a function of temperature for a material having a narrow open time and a fast cure system.
Figure 5:
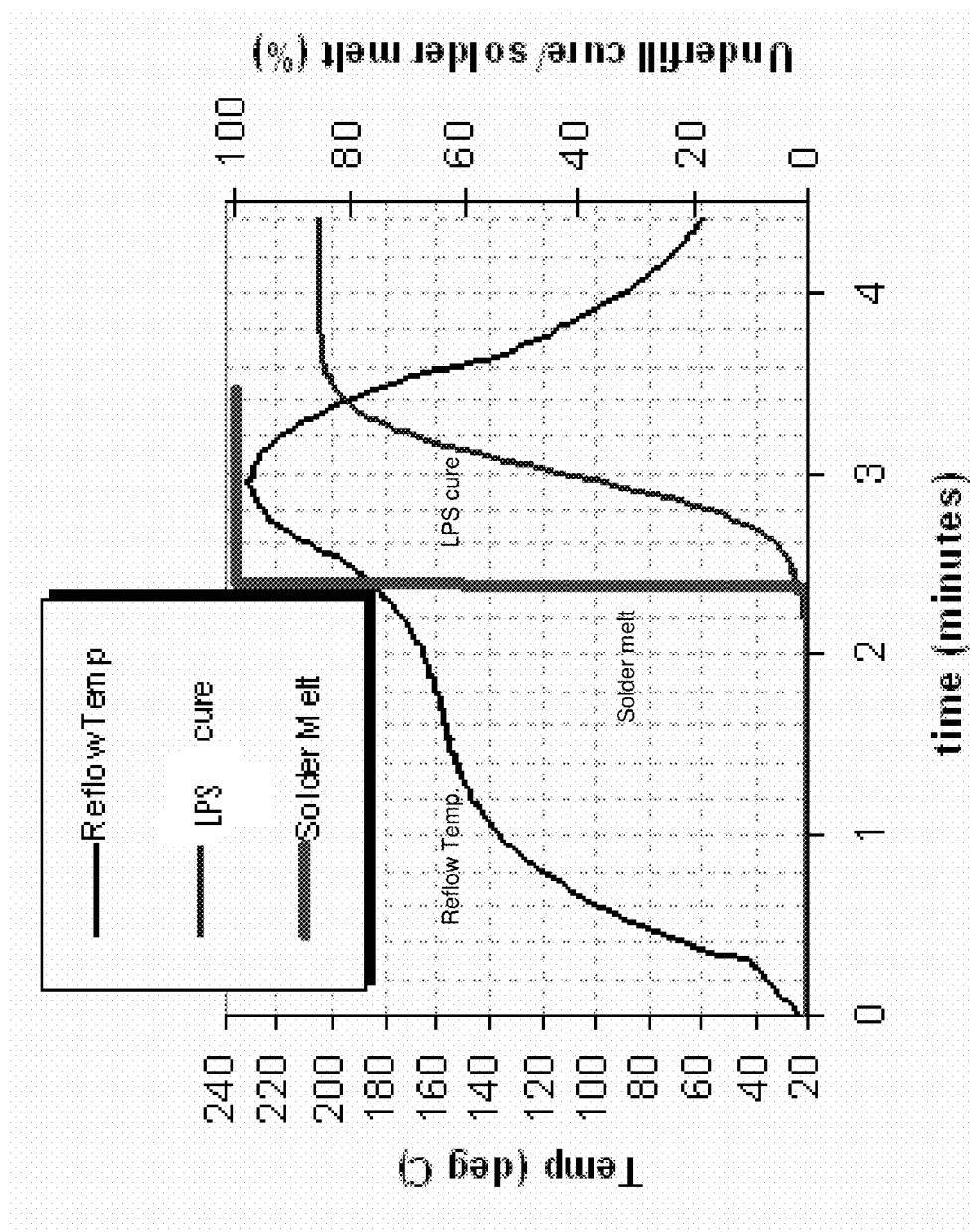
FIG. 5 shows a time profile as a function of temperature for a material having a broad open time and a slow cure system.

Controlling the cure kinetics of the polymer phase is desirable for the optimal performance of the materials. The "open-time" in these systems may be characterized by the time between when solder melting occurs, and the time when the polymer gels—which essentially freezes-in the morphology at that instant. See J. Hurley et al. *Proc., $52^{nd}$ Elect. Comp. Tech Conf.* 2002. pp: 828-833. FIG. 4 shows a material having a narrow open time and a fast cure system, and FIG. 5 shows a material having a broad open time and a slow cure system.

Figure 6:
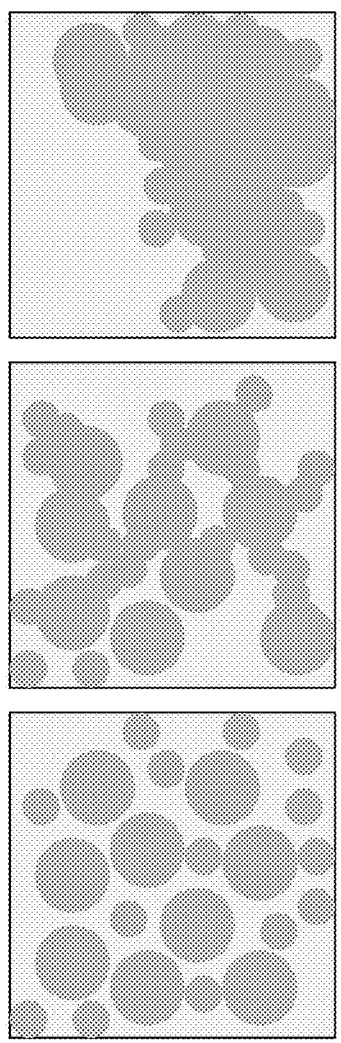
FIGS. 6A-6C are representations showing various metal and binder distributions, in accordance with certain examples.

On the one hand, the binder must not gel so quickly, as to inhibit the fluxing reaction and formation of a continuous metal network above the solder liquidus. On the other hand, the two networks (metal and polymer) are thermodynamically incompatible due to differences in their densities and surface energies. Over an extended open-time at temperature above the liquidus, gross phase separation of the metal and polymer phases will occur—leading to a morphology with less than desirable properties. This relationship is shown diagrammatically in FIGS. 6A-6C, where the metal (gray) and the polymer (yellow) are shown as a function of time. Referring to FIG. 6A, insufficient open time leads to poor network formation with isolated metal particles. A moderate open time leads to desirable network formation with conductive pathways (FIG. 6B). Excessive open time may lead to gross phase separation of the metal and polymer domains and poor electrical properties (FIG. 6C). Variation in the open time may be achieved by changing the type and concentration of cure accelerator used, and by varying the reflow profile. Characterization of the cure kinetics using experimental DSC data and kinetic models such as the "autocatalytic" or Kamal-Sourour approach are highly useful in this regard. See Y. Lei et al. *J. Appl. Poly. Sci*, vol. 100, (2006) pp. 1642-1658.

Example 4

A composition may be prepared that includes a mono-acid ester hybrid, a resin capable of reaction with the hybrid, a metal power (e.g., copper powder) and a solder. The ester hybrid may include a carboxylic acid and may contain organic groups to enhance mechanical properties or improve compatibility with the organic phase. Optionally the copper is protected with a barrier coating. Optionally a latent catalyst is added to control cure kinetics and gelation. Optionally a monofunctional reactive diluent is added to control molecule weight.

Example 5

A monofunctional sulfonic acid and a resin capable of reaction with the sulfonic acid, a copper powder, and a solder may be used to prepare a composition. The sulfonic acid molecule may contain organic groups to enhance mechanical properties or improve compatibility with the organic phase. Optionally the copper is protected with a barrier coating. Optionally a latent catalyst is added to control cure kinetics and gelation. Optionally a monofunctional reactive diluent is added to control molecule weight.

Example 6

A monofunctional phosphonic acid, a resin capable of reaction with the phosphonic acid, a copper powder, and a solder may be used to prepare a composition. The phosphonic acid molecule may contain organic groups to enhance mechanical properties or improve compatibility with the organic phase. Optionally the copper is protected with a barrier coating. Optionally a latent catalyst is added to control cure kinetics and gelation. Optionally a monofunctional reactive diluent is added to control molecule weight

Example 7

A monofunctional perfluoro carboxylic acids, a resin capable of reaction with the perfluoro carboxylic acid, a copper powder, and a solder may be used to prepare a composition. The perfluoro carboxylic acid molecule may contain organic groups to enhance mechanical properties or improve compatibility with the organic phase. Optionally the copper is protected with a barrier coating. Optionally a latent catalyst is added to control cure kinetics and gelation. Optionally a monofunctional reactive diluent is added to control molecule weight

Example 8

A composition that contains a molecule with one acid functional group capable of removing metal oxide and a separate functional group capable of polymerization in which proton exchange is not involved in the reaction pathway may be used to prepare a composition as described herein.

Example 9

A composition that contains a molecule with one acid functional group capable of removing metal oxide and a thermoplastic resin with appropriate functional groups capable of binding and tight association with the acid functional group such that it is immobilized to prevent corrosion may be used to prepare a composition as described herein.

Example 10

Any of the compositions disclosed herein may include a UV curable resin capable of reacting with the molecule capable of fluxing. The UV curable resin can be cured after the metal network is formed in order to immobilize the flux residue.

Example 11

A composition such that the cure kinetics and the molecular weight are designed to minimize polymer domain size within the composition structure leading to a joint where a polymer domain is less than 50% of the bond line thickness may be prepared. This thickness can be controlled by reactivity and functionality of the reactive polymeric resin, the amount of mono-acid ester hybrid molecule, the type and amount of catalyst, the heating profile, and/or the type and amount of monofunctional reactive resin.

Example 12

Preapplying one or more of the compositions to a wafer or substrate followed by drying or partial polymerization (b-staging) may be performed. One suitable composition may include a solid epoxy resin that would result in tack free surfaced after drying or b-staging. In addition, the b-staging could be controlled by selecting resin types that have different cure kinetics. The intent is to cure (i.e., cross-link) only a portion of the organic binder such that it yields a tack free surface that allows the end user to handle with ease. The unreacted or latent resin is soft, or is capable of softening when heated, and forms and adhesive bond during with the aid or heat, pressure or both.

Example 13

The mono-acid ester hybrid may be used in a cleaning process to remove oxide from the metal powders prior to mixing with the organic phase and to limit the monofunctional carboxylic acid used to provide for good sintering. This composition may also contain stabilizers to prevent oxidation of the metal powder during storage and handling

Example 14

Any of the compositions disclosed herein may be used in combination with a "proton sponge" such as, for example, 1,5-dialkyl pyridines to regulate acid levels in the composition.

Example 15

Several paste formulations were made by mixing various levels of copper powder with solder powders, epoxy resin, mono ester acid ester hybrid, anhydride and catalyst. Formulations listed in Table 1 were prepared by first mixing the organic components and then slowly adding metal powders with mixing. The formulations resulted in a smooth lump free creamy paste. All formulations were prepared with 8% organic binder and 92% metal filler. The ratios of the organic components were kept constant for formulations A, B and C. A ten gram sample, referenced as Run A in table 1 was prepared by mixing 3.7 grams of a low oxygen containing copper powder (mean particle size ~25 microns), 2.76 grams of Sn(42)Bi(58) solder powder, 2.76 grams of SnAgCu solder powder, with 0.13 grams of the mono acid ester hybrid listed in Example 1, 0.43 grams of electronic grade epoxidized bisphenol F resin, 0.01 g of 2P4MZ imidazole catalyst, and 0.23 g of a liquid anhydride.

Bulk thermal conductivity samples were prepared for formulations A, B and C. The samples were prepared by dispensing the paste in a silicone mold and reflowed using the temperature profile specified in FIG. 4. Bulk thermal conductivities were obtained by using a Netzsch LFA 447 tester. The results are listed in Table 1. The values in the table below refer to the ratios of Cu, SnBi and SAC, based on the amounts of these three components in the mixture, and not the weight percentages or absolute values in the overall composition.

TABLE 1

| Run | Cu | SnBi | SAC | $K_{Bulk}$, W/m-K |
|---|---|---|---|---|
| A | 40 | 30 | 30 | 30 |
| B | 45 | 27.5 | 27.5 | 26 |
| C | 50 | 25 | 25 | 29.2 |

Example 16

Several paste formulations were made by mixing various ratios of SnAgCu and SnBi solder powders with copper powders, epoxy resin, mono ester acid ester, anhydride and catalyst. Formulations listed in Table 2 were prepared by first mixing organic components then slowly adding metal powders with mixing. The formulations resulted in a smooth lump free creamy paste. All formulations were prepared with 8% organic binder and 92% metal filler. The ratios of the organic components were kept constant for formulations D through G. A ten gram sample, referenced as Run D in Table 2 was prepared by mixing 3.7 grams of a low oxygen containing copper powder (mean particle size ~25 microns), 1.84 grams of Sn(42)Bi(58) solder powder, 3.68 grams of SnAgCu (SAC) solder powder, with 0.13 grams of the mono acid ester hybrid listed in example 1, 0.43 grams of electronic grade epoxidized bisphenol F resin, 0.01 g of 2P4MZ imidazole catalyst, and 0.23 g of a liquid anhydride. The values in the table below refer to the relative ratios of Cu, SnBi and SAC and not the weight percentages or absolute values.

TABLE 2

| Run | Cu | SnBi | SAC | $K_{Bulk}$, W/m-K |
|---|---|---|---|---|
| D | 40 | 20 | 40 | 24.2 |
| E | 40 | 40 | 20 | 36.6 |
| F | 45 | 27.5 | 27.5 | 32 |
| G | 45 | 27.5 | 27.5 | 27.4 |
| H | 50 | 20 | 30 | 25.2 |
| I | 50 | 30 | 20 | 32.7 |

Example 17

Several reflow conditions including time above liquidus, peak temperature and post bake conditions were evaluated and listed in Table 3. Formulation B from Example 15 was used for all conditions listed in Table 3. The shape of the reflow curve was generally consistent with the curve shown in FIG. 2 however peak temperatures and time above 230° C. was varied.

TABLE 3

| Time Above 230° C. (sec) | Peak Temp (° C.) | Post-bake at 175 C. for X HRS | $K_{effective}$, W/m-K |
|---|---|---|---|
| 30 | 245 | Yes, 1 hr | 16 |
| 30 | 245 | Yes, 4 hrs | 12 |
| 180 | 245 | None | 25 |
| 30 | 265 | None | 24 |
| 30 | 265 | Yes, 1 hr | 23 |
| 30 | 265 | Yes, 4 hrs | 13 |
| 180 | 265 | None | 31 |
| 180 | 265 | Yes, 1 hr | 47 |
| 180 | 265 | Yes, 4 hrs | 38 |

Example 18

Several paste formulations were made by mixing various types of epoxy catalysts with SnAgCu solder powder, SnBi solder powders, a silver coated copper powder, epoxy resin, mono ester acid ester, anhydride and catalyst. Formulations listed in Table 4 were prepared by first mixing organic components then slowly adding metal powders with mixing. The formulations resulted in a smooth lump free creamy paste. All formulations were prepared with 8% organic binder and 92% metal filler. The ratios of the organic components were kept constant for formulations D through G. A ten gram sample, referenced as Run J-K in Table 4 were prepared by mixing 4.1 grams of a silver coated copper powder (mean particle size ~25 microns), 2.53 grams of Sn(42)Bi(58) solder powder, 2.53 grams of SnAgCu solder powder, with 0.13 grams of the mono acid ester hybrid listed in example 1, 0.43 grams of electronic grade epoxidized bisphenol F resin, 0.01 g of either catalyst listed in Table 4, and 0.23 g of a liquid anhydride.

TABLE 4

| Run | Catalyst | $K_{Bulk}$, W/m-K | $K_{effective}$, W/m-K |
|---|---|---|---|
| J | 2P4MZ | 23.1 | 21.1 |
| K | TPPK | 22.6 | 18.8 |
| L | 2E4MZ | 20 | 22 |

Example 19

Two formulations with various levels of monofunctional acid esters with SnAgCu solder powder, SnBi solder powder, a silver coated copper powder, epoxy resin, anhydride and catalyst were made. Formulations listed in Table 5 were prepared by first mixing organic components then slowly adding metal powders with mixing. The formulations resulted in a smooth lump free creamy paste. All formulations were prepared with 8% organic binder and 92% metal filler. A ten gram sample, referenced as Run M, in Table 4 was prepared by mixing 3.7 grams of a low oxygen containing Cu powder (mean particle size ~25 microns), 2.76 grams of Sn(42)Bi(58) solder powder, 2.76 grams of SnAgCu solder powder, with 0.13 grams of the mono acid ester hybrid listed in example 1, 0.43 grams of electronic grade epoxidized bisphenol F resin, 0.01 g of 2P4MZ imidazole catalyst, and 0.23 g of a liquid anhydride. A ten gram sample, referenced as Run N, in Table 4 was prepared by mixing 3.7 grams of a low oxygen containing Cu powder (mean particle size ~25 microns), 2.76 grams of Sn(42)Bi(58) solder powder, 2.76 grams of SnAgCu solder powder, with 0.16 grams of the mono acid ester hybrid listed in example 1, 0.43 grams of electronic grade epoxidized bisphenol F resin, 0.01 g of 2P4MZ imidazole catalyst, and 0.2 g of a liquid anhydride.

TABLE 5

| Run | Flux Conc. | $K_{Bulk}$, W/m-K | $K_{effective}$, W/m-K |
|---|---|---|---|
| M | 0.4 | 38.5 | 22 |
| N | 0.6 | 34 | 17 |

Example 20

Work Life

Figure 7:
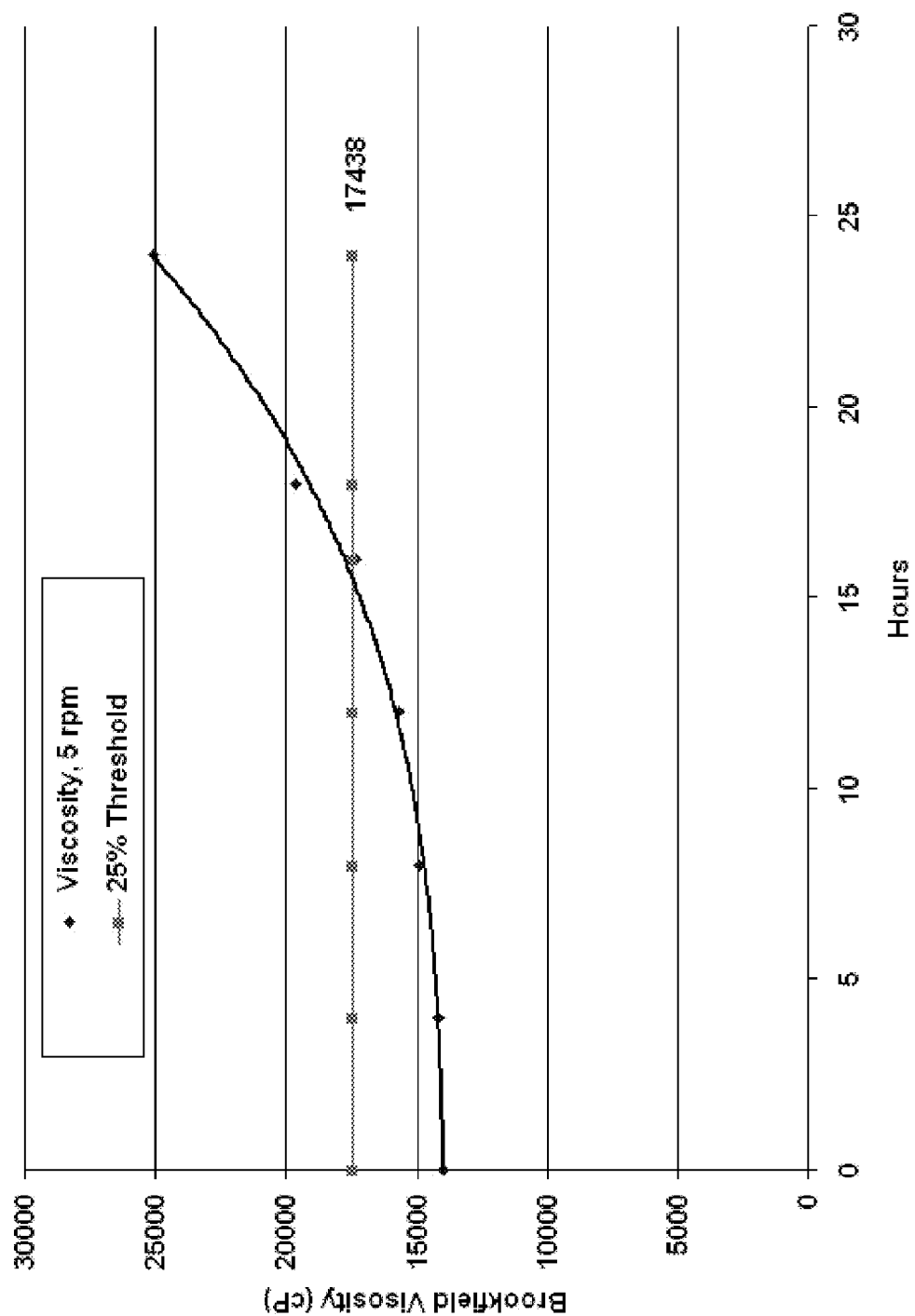
FIG. 7 is graph showing viscosity change of a formulation, in accordance with certain examples, where the x axis represents time in hours and the y axis represents viscosity in centiPoise.

It is common in the electronic assembly and semiconductor packaging industry to test the "pot life" or "work life" of a paste composition by measuring increase of viscosity vs. time at ambient conditions. It is generally accepted that a viscosity increase of <100% over an eight hour period is workable on a manufacturing line. FIG. 7 shows the viscosity change for Formulation B from Example 15. The test was carried out using a Brookfield DVII+ with a CP-51 spindle. Values are listed in centipoises at 5 RPM rotation.

Example 21

Conversion Compared to Other Acids

Figure 8:
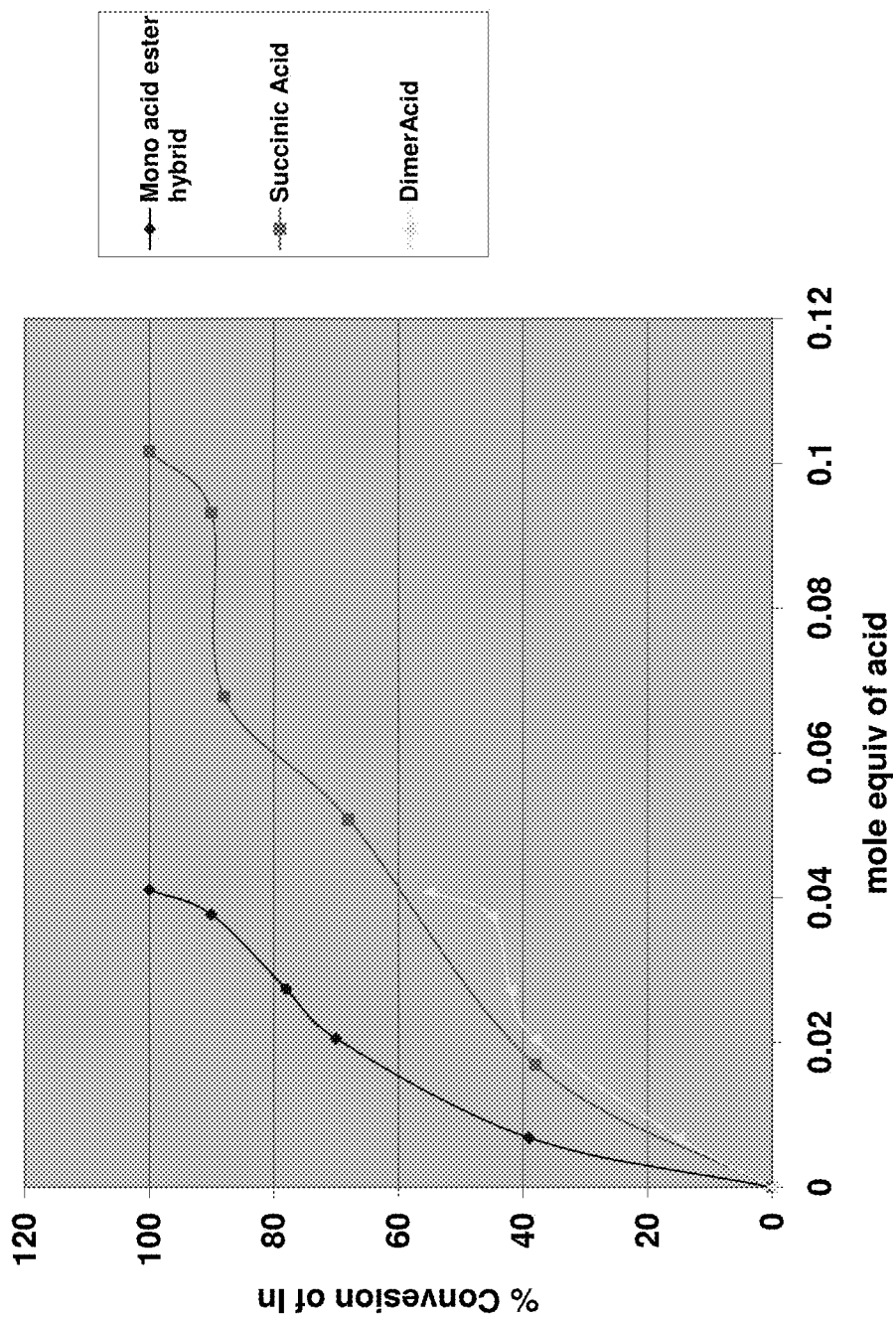
FIG. 8 is a differential scanning calorimeter of a formulation during conversion, in accordance with certain examples.

The monofunctional acid ester hybrid from Example 15 has been found to have superior fluxing power compared with more conventional liquid acids such as dimmer acid or a solid acid such as succinic acid. Several formulations were prepared to show superior fluxing efficacy of the mono-functional acid ester hybrid resins with equivalent mole equivalents of acid. For example, A 10 gram sample, with 0.02 mole equivalents (0.277 grams) of the mono acid ester hybrid listed in example 1, mixed with 5.95 grams of a low oxygen containing Cu powder (mean particle size ~25 microns), 1.28 grams of Indium solder powder, 1.28 grams of SnAgCu solder powder, 0.9 grams of electronic grade epoxidized bisphenol F resin, 0.002 g of 2P4MZ imidazole catalyst, and 0.32 g of a liquid anhydride. The disappearance of In and SnAgCu alloys was monitored by Differential Scanning calorimetry (DSC) as it was converted to corresponding copper intermetallics. This conversion is listed on the Y axis of FIG. 8. Formulations using succinic acid or dimer acid were made replacing the mono acid ester hybrid and balancing the formulations with correct mole equivalents of epoxidized bisphenol F resin and anhydride. Conversion of In to corresponding copper intermetallics was measured as shown in FIG. 8

Example 22

Demonstration of Free Mono Acids, for Example, Levulinic Acid

Several paste formulations were made to test different terminating acids. SnAgCu powder with copper powder were combined with epoxy resins, a keto acid (levulinic acid) or mono-ethyl succinate, and a catalyst. Formulations listed in Table 6 were prepared by first mixing organic components then slowly adding metal powders with mixing. The formulations resulted in a smooth lump free creamy paste. Both formulations were prepared with 12% organic binder and 88% metal filler. A ten gram sample, referenced as Run 1 in Table 6, was prepared by mixing 2.2 grams of a low oxygen containing copper powder (mean particle size ~25 microns), 6.6 grams of low oxygen SnAgCu (SAC) solder powder, with 0.2 grams of the levulinic acid, 0.4 grams of electronic grade epoxidized 1,6 hexanedioldiglycidyl resin, 0.3 grams MHHPA, 0.2 grams of a monofunctional aliphatic glycidyl ether, 0.01 g of TPPK catalyst, and 0.23 g of a liquid anhydride. The results in Table 6 represent the effectiveness of the chain terminating mechanism from use of either Levulinic Acid or Mono-ethyl Succinate, which both provide long pot-life while achieving excellent bulk thermal conductivity.

TABLE 6

| Run | Flux Acid | Organic | Cu | SnBi | SAC | Potlife-hrs | $K_{Bulk}$m-K |
|-----|-----------|---------|------|------|------|-------|---------|
| 1 | Levulinic Acid | 12 | 26.4 | 0 | 61.6 | >15 | 25.0 |
| 2 | Mono-ethyl Succinate | 12 | 26.4 | 0 | 61.6 | >15 | 27.4 |

When introducing elements of the examples disclosed herein, the articles "a," "an," and "the" are intended to mean that there are one or more of the elements. The terms "comprising," "including" and "having" are intended to be open ended and mean that there may be additional elements other than the listed elements. It will be recognized by the person of ordinary skill in the art, given the benefit of this disclosure, that various components of the examples can be interchanged or substituted with various components in other examples.

Although certain features, aspects, examples and embodiments have been described above, additions, substitutions, modifications, and alterations of the disclosed illustrative features, aspects, examples and embodiments will be readily recognized by the person of ordinary skill in the art, given the benefit of this disclosure.

What is claimed is:

1. An electronic component, comprising:
a semiconductor chip with a solderable surface to provide one or more vertical interconnection pathways; and
a cured electrically conductive composition disposed on the solderable surface of the semiconductor chip, the composition comprising, prior to curing,
an mono-acid hybrid comprising an unprotected, single reactive group at a first terminus and substantially non-reactive groups elsewhere such that the mono-acid hybrid is functional as a chain terminator,
an epoxy resin, and
an effective amount of at least one metal to render the composition electrically conductive, wherein the mono-acid hybrid of the composition is a compound having the following formula:

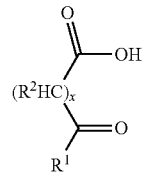

wherein X equals 1 to 9 and $R^1$ and $R^2$ are each independently selected from the group consisting of H, C1-C6 alkyl groups, C1-C6 aliphatic groups, C1-C6 alkoxy groups, and C1-C9 aromatic groups, any of which may be substituted with one or more functionalities that are substantially non-reactive to avoid cross-linking with other components of the composition.

* * * * *